United States Patent
Schwartz et al.

(10) Patent No.: US 9,419,250 B2
(45) Date of Patent: Aug. 16, 2016

(54) METHODS OF FORMING TRANSFER FILMS

(71) Applicant: 3M INNOVATIVE PROPERTIES COMPANY, St. Paul, MN (US)

(72) Inventors: Evan L. Schwartz, Vadnais Heights, MN (US); Justin P. Meyer, Oakdale, MN (US); Olester Benson, Woodbury, MN (US); Terry O. Collier, Woodbury, MN (US); Michael Benton Free, St. Paul, MN (US); Robert F. Kamrath, Mahtomedi, MN (US); Mieczyslaw H. Mazurek, Roseville, MN (US); David B. Olson, Hudson, WI (US); K. Raveesh Shenoy, St. Paul, MN (US); Martin B. Wolk, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 14/959,770

(22) Filed: Dec. 4, 2015

(65) Prior Publication Data

US 2016/0087246 A1    Mar. 24, 2016

Related U.S. Application Data

(62) Division of application No. 14/159,300, filed on Jan. 20, 2014.

(51) Int. Cl.
*H01L 51/52* (2006.01)
*B32B 3/26* (2006.01)
(Continued)

(52) U.S. Cl.
CPC ...... *H01L 51/5281* (2013.01); *B29D 11/00788* (2013.01); *B32B 3/263* (2013.01); *B32B 27/308* (2013.01); *B32B 37/18* (2013.01); *B32B 38/0036* (2013.01); *B32B 38/06* (2013.01); *G03F 7/091* (2013.01); *H01L 51/0024* (2013.01); *H01L 51/5275* (2013.01); *B29K 2083/00* (2013.01); *B29K 2995/0018* (2013.01); *B32B 38/1858* (2013.01); *B32B 2037/1253* (2013.01); *B32B 2250/02* (2013.01); *B32B 2309/10* (2013.01); *B32B 2310/0831* (2013.01); *B32B 2419/00* (2013.01);
(Continued)

(58) Field of Classification Search
CPC .................. B32B 38/0036; H01L 51/5281
See application file for complete search history.

(56) References Cited

U.S. PATENT DOCUMENTS

| RE24,906 E | 12/1960 | Ulrich |
| 5,453,104 A | 9/1995 | Schwabel |

(Continued)

FOREIGN PATENT DOCUMENTS

| EP | 1 003 078 A2 | 5/2000 |
| EP | 1 003 078 A3 | 11/2001 |

(Continued)

OTHER PUBLICATIONS

Bass et al., "Transfer Molding of Nanoscale Oxides Using Water-Soluble Templates," *ACS Nano*, 2011; 5(5):4065-4072.

(Continued)

*Primary Examiner* — Lex Malsawma
(74) *Attorney, Agent, or Firm* — Jeffrey S. Kollodge

(57) ABSTRACT

Methods of making transfer films to form bridged nanostructures are disclosed. The methods include applying a thermally stable backfill layer to a structured surface of a sacrificial template layer.

7 Claims, 14 Drawing Sheets

(51) Int. Cl.
*B32B 27/30* (2006.01)
*B32B 37/18* (2006.01)
*B32B 38/00* (2006.01)
*B32B 38/06* (2006.01)
*G03F 7/09* (2006.01)
*B29D 11/00* (2006.01)
*H01L 51/00* (2006.01)
*B32B 38/18* (2006.01)
*B32B 37/12* (2006.01)
*B29K 83/00* (2006.01)

(52) U.S. Cl.
CPC ........ *B32B 2457/00* (2013.01); *B32B 2457/12* (2013.01); *H01L 2251/5307* (2013.01); *H01L 2251/5315* (2013.01); *Y10T 156/10* (2015.01); *Y10T 428/24521* (2015.01)

(56) References Cited

U.S. PATENT DOCUMENTS

| | | | |
|---|---|---|---|
| 6,027,595 | A | 2/2000 | Suleski |
| 6,376,590 | B2 | 4/2002 | Kolb |
| 6,396,079 | B1 | 5/2002 | Hayashi |
| 6,521,324 | B1 | 2/2003 | Debe |
| 6,849,558 | B2 | 2/2005 | Schaper |
| 6,858,253 | B2 | 2/2005 | Williams |
| 7,241,437 | B2 | 7/2007 | Davidson |
| 7,384,809 | B2 | 6/2008 | Donofrio |
| 7,833,820 | B2 | 11/2010 | Rantala |
| 8,911,581 | B2 | 12/2014 | Chiu |
| 2002/0081787 | A1 | 6/2002 | Kohl |
| 2003/0219992 | A1 | 11/2003 | Schaper |
| 2004/0102031 | A1 | 5/2004 | Kloster |
| 2004/0137728 | A1 | 7/2004 | Gallagher |
| 2004/0190102 | A1 | 9/2004 | Mullen |
| 2007/0236939 | A1* | 10/2007 | Ouderkirk ............ G02B 6/0053 362/339 |
| 2007/0242055 | A1 | 10/2007 | Lai |
| 2008/0304287 | A1 | 12/2008 | Chiang |
| 2009/0195150 | A1 | 8/2009 | Chen |
| 2009/0322219 | A1 | 12/2009 | Wolk |
| 2010/0006211 | A1 | 1/2010 | Wolk |
| 2010/0104807 | A1 | 4/2010 | Chiu |
| 2010/0151207 | A1 | 6/2010 | Hansen |
| 2010/0160577 | A1 | 6/2010 | Hirano |
| 2011/0058150 | A1 | 3/2011 | Schaper |
| 2011/0081496 | A1 | 4/2011 | Iyer |
| 2011/0182805 | A1 | 7/2011 | DeSimone |
| 2011/0305787 | A1 | 12/2011 | Ishii |
| 2012/0098421 | A1* | 4/2012 | Thompson ............ B32B 27/08 313/512 |
| 2012/0099323 | A1* | 4/2012 | Thompson .......... H01L 51/5275 362/257 |
| 2012/0235115 | A1 | 9/2012 | Kang |
| 2013/0011608 | A1* | 1/2013 | Wolk .................... B29C 67/202 428/141 |
| 2013/0114269 | A1 | 5/2013 | Domercq |
| 2013/0273292 | A1 | 10/2013 | Kim |
| 2013/0319522 | A1 | 12/2013 | Koike |
| 2014/0021492 | A1 | 1/2014 | Wolk |
| 2014/0169000 | A1 | 6/2014 | Hsu |
| 2014/0175707 | A1 | 6/2014 | Wolk |
| 2014/0178646 | A1* | 6/2014 | Wolk ...................... B32B 3/263 428/161 |
| 2014/0242343 | A1* | 8/2014 | Free ......................... B44C 1/17 428/164 |
| 2014/0248458 | A1 | 9/2014 | Sherman |
| 2015/0136315 | A1 | 5/2015 | Kim |

FOREIGN PATENT DOCUMENTS

| | | |
|---|---|---|
| JP | 2002093315 | 3/2002 |
| KR | 10-2013-0116648 | 10/2013 |
| WO | WO 2012/077738 | 6/2012 |

OTHER PUBLICATIONS

Chiniwalla et al., "Multilayer planarization of polymer dielectrics," *IEEE Trans. Adv. Packaging*, 2001; 24(1):41-53.

Corbin et al., "Engineered Porosity via Tape Casting, Lamination and the Percolation of Pyrolyzable Particulates," *J. Am. Ceram. Soc.*, 1999; 82(7):1693-701.

Fréchet et al., "Thermally Depolymerizable Polycarbonates V. Acid Catalyzed Thermolysis of Allylic and Benzylic Polycarbonates: A New Route to Resist Imaging," *Polymer Journal*, 1987; 19(1):31-49.

Hua et al., "Photodefinable Thermally Sacrificial Polycarbonate Materials and Methods for MEMS and Microfluidic Device Fabrication," *ECS Transactions*, 2006; 3(10):389-397.

Jeong et al., "Vacuum Nano-Hole Array Embedded Organic Light Emitting Diodes," *Nanoscale*, 2013; pp. 1-8.

Kim et al., "Effects of the Substrate Pretreatments on the Leakage Current in the Low-Temperature Poly-Si TFTs," *Mat. Res. Soc. Symp. Proc.*, 1997, vol. 448:419-23.

Kohdoh et al., "Surface treatment of sheet glass. Present status and future prospects," *J. of Non-Crystalline Solids*, 1994; 178:189-198.

Mistier et al., *Tape Casting: Theory and Practice. American Ceramic Society*, Hoboken, NJ 2000; Ch. 2 (Materials Technology and Selection), pp. 7-62, 2000.

Shaw et al., "Negative photoresists for optical lithography," *IBM Journal of Research and Development*, 1997; 41(1/2):81-94.

White, "Advanced Methods, Materials, and Devices for Microfluidics," Dissertation, Georgia Institute of Technology, Nov. 2003.

White et al., "Microsystems Manufacturing via Embossing of Photodefinable Thermally Sacrificial Materials," *Emerging Lithographic Technologies VIII*, 2004, 5374:361-370.

* cited by examiner

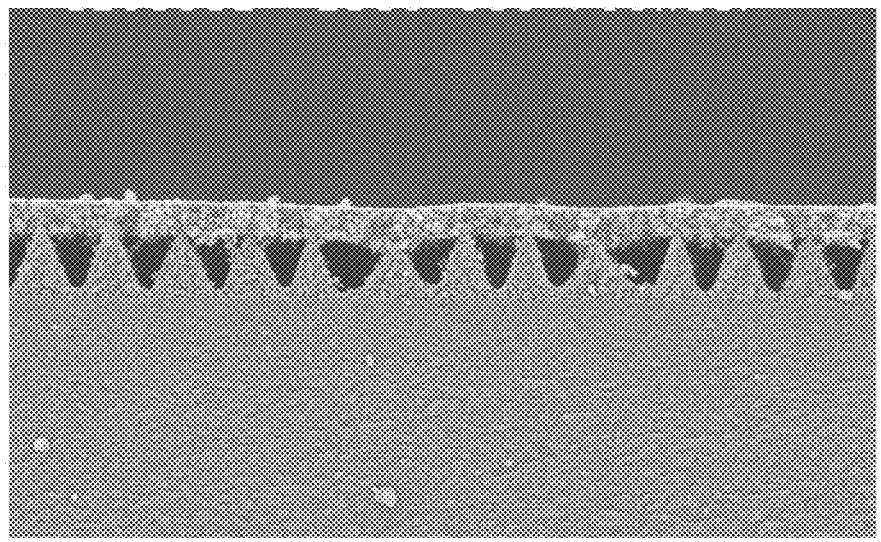
*FIG. 8A*  2.00μm
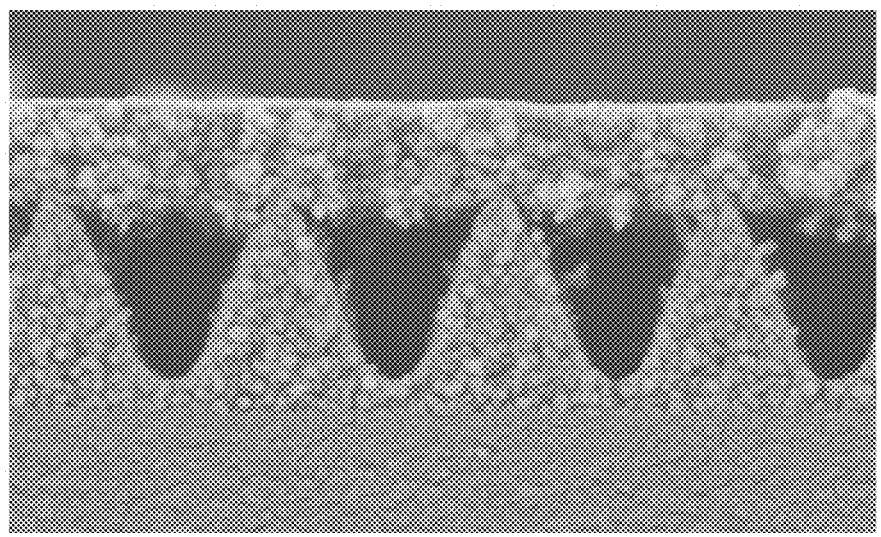
*FIG. 8B*  600nm

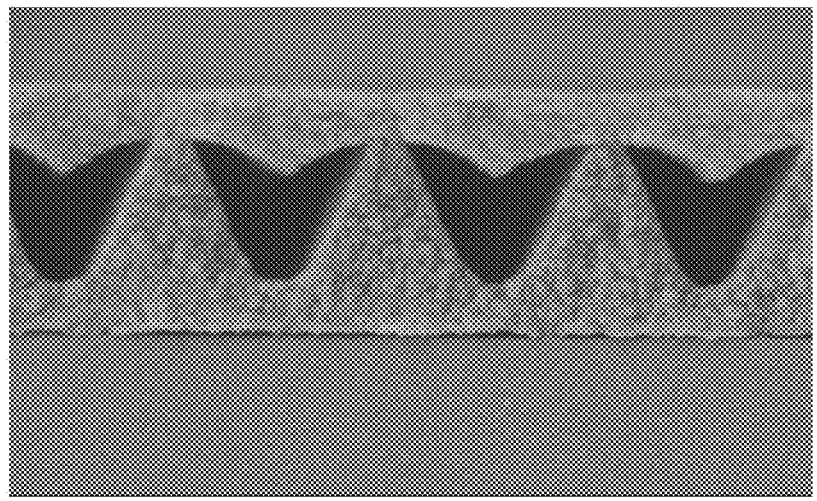
*FIG. 12*  600nm
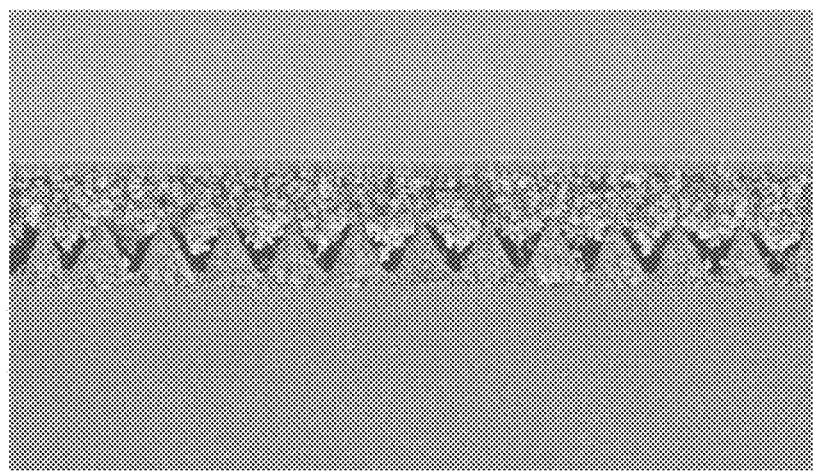
*FIG. 13A*  2.00μm
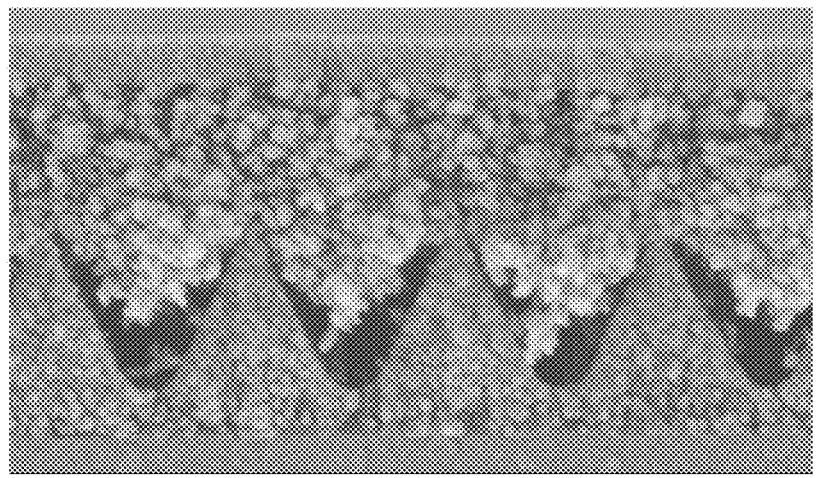
*FIG. 13B*  600nm

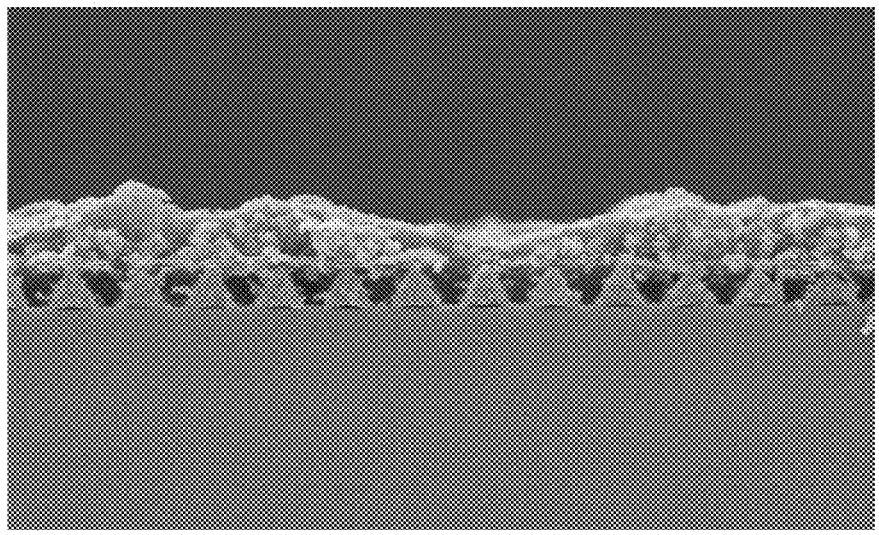
*FIG. 18*  2.00μm
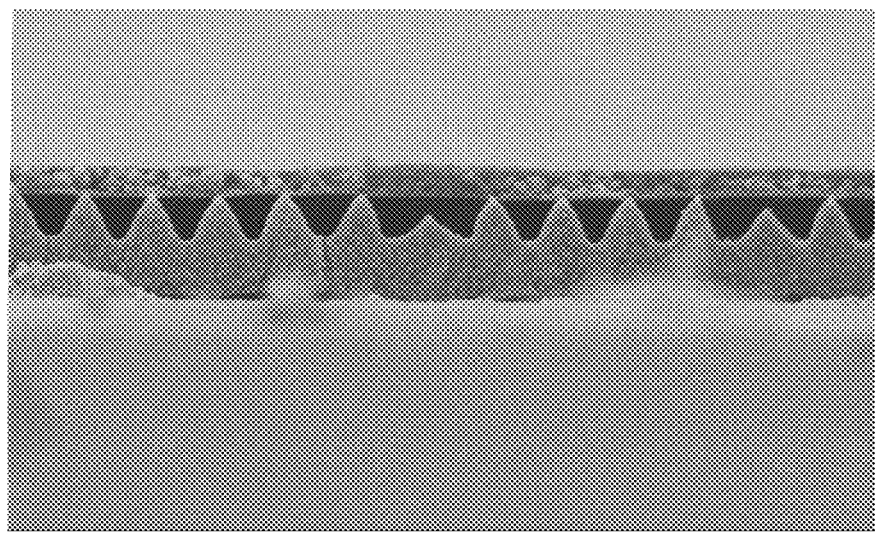
*FIG. 19*  2.00μm

METHODS OF FORMING TRANSFER FILMS

BACKGROUND

Nanostructures and microstructures on glass substrates are used for a variety of applications in display, lighting, architecture and photovoltaic devices. In display devices the structures can be used for light extraction or light distribution. In lighting devices the structures can be used for light extraction, light distribution, and decorative effects. In photovoltaic devices the structures can be used for solar concentration and antireflection. Patterning or otherwise forming nanostructures and microstructures on large glass substrates can be difficult and expensive.

SUMMARY

The present disclosure relates to lamination transfer films for forming articles with engineered voids and methods of forming these lamination transfer films. The engineered voids in the final articles are defined by a nanostructured layer and a bridge structure on the nanostructured layer.

In one aspect, a transfer film includes a sacrificial template layer having a first surface and a second surface having a structured surface opposite the first surface and a thermally stable backfill layer conforming to the structured surface of the sacrificial template layer. A portion of the sacrificial template layer that is proximate the first surface has a greater concentration of a thermally stable molecular species than a portion of the sacrificial template layer that is proximate the second surface.

In another aspect, a method includes laminating the transfer film described above to a receptor substrate and baking out the sacrificial template layer to form engineered voids defined by a bridging layer and the structured surface of the thermally stable backfill layer. The bridging layer is formed from the thermally stable molecular species within the sacrificial template layer and the bridging layer is disposed on the structured surface.

In another aspect, a method of forming a transfer film includes applying a thermally stable backfill layer to a structured surface of a sacrificial template layer and allowing a portion of the thermally stable backfill layer to migrate into the sacrificial template layer to form the transfer film. The thermally stable backfill layer conforms to the structured surface of the sacrificial template layer In another aspect a method of forming a transfer film includes forming a first layer having a thermally stable molecular species and disposing a sacrificial template layer onto the first layer. The sacrificial template layer includes a first surface contacting the first layer and an opposing second surface being a structured surface. The method further includes applying a thermally stable backfill layer to a structured surface of a sacrificial template layer. The thermally stable backfill layer conforms to the structured surface of the sacrificial template layer and the thermally stable molecular species does not migrate from the thermally stable backfill layer. The first layer is separated from the thermally stable backfill layer by the sacrificial template layer.

In a further aspect, a bottom emitting OLED includes a light transparent support layer and a nanostructured layer on the support substrate. The nanostructured layer includes a structured surface layer and a bridging layer on the structured surface layer defining a plurality of engineered voids. An OLED structure is disposed on the bridging layer. The OLED structure includes an OLED layer separating a top electrode and a bottom electrode.

In a still further aspect, a top emitting OLED includes a support layer and an OLED structure disposed on the bridging layer. The OLED structure includes an OLED layer separating a top electrode and a bottom electrode. An optional optically coupling and planarizing layer is disposed on the top electrode. A nanostructured layer is on the optically coupling and planarizing layer or adjacent to the OLED structure. The nanostructured layer includes a structured surface layer and a bridging layer on the structured surface layer and defining a plurality of engineered voids. A light transparent layer is disposed on the structured surface layer.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which:

FIGS. 8A and 8B illustrate cross-sectional SEM micrographs of an illustrative baked out final bridged nanostructure at a 15 k (8A) magnification and at a 50 k magnification (8B);

FIG. 12 illustrates a cross-sectional SEM micrograph of another illustrative baked out final bridged nanostructure;

FIGS. 13A and 13B illustrate cross-sectional SEM micrographs of another illustrative baked out final bridged nanostructure at a 15 k magnification (13A) and at a 50 k magnification (13B);

Figure 16:
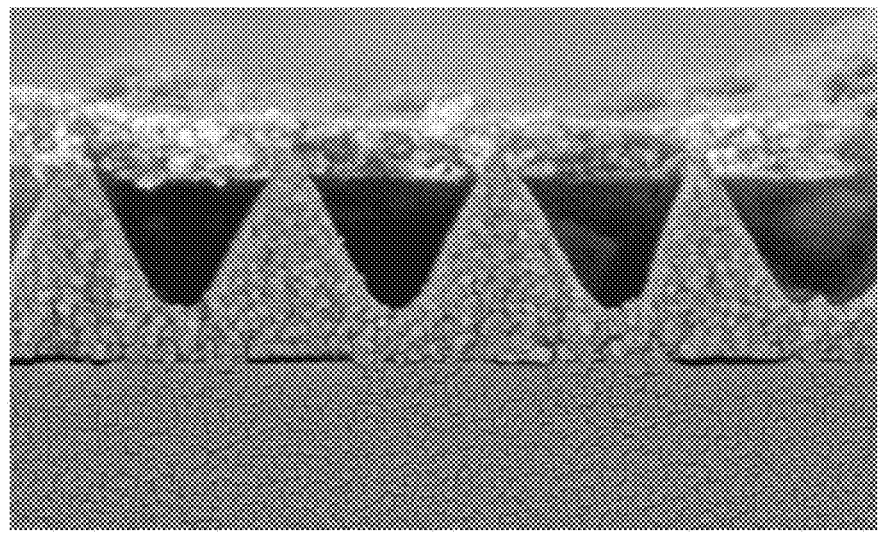
Figure 17:
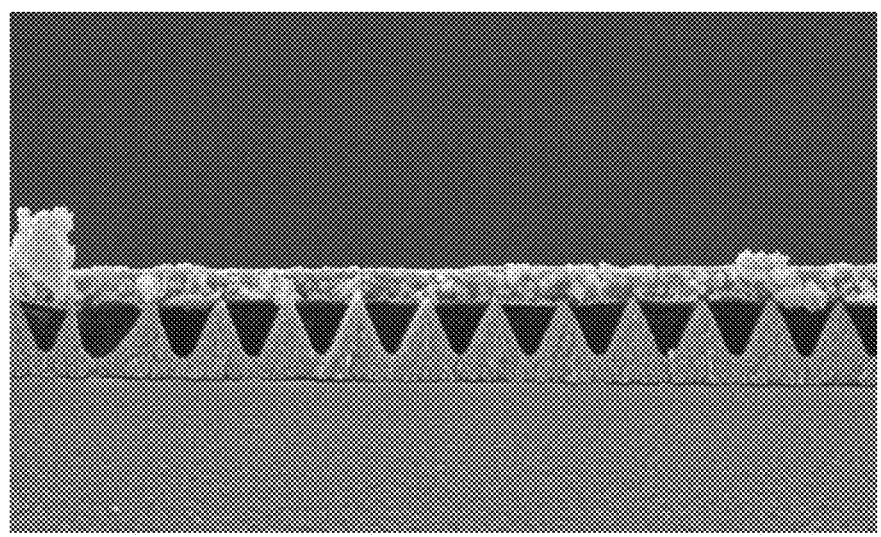

601 showing silicon containing migratable species at the top surface of the sacrificial resin layer;

FIG. 16 is a cross-sectional SEM micrographs of an illustrative baked out final bridged nanostructure of Example 6a at a 50 k magnification;

FIG. 17 is a cross-sectional SEM micrographs of an illustrative baked out final bridged nanostructure of Example 6b at a 15 k magnification;

FIG. 18 is a cross-sectional SEM micrographs of an illustrative baked out final bridged nanostructure of Example 6c; and FIG. 19 is across-sectional SEM micrographs of an illustrative baked out final bridged nanostructure of Example 6d.

DETAILED DESCRIPTION

In the following detailed description, reference is made to the accompanying drawings that form a part hereof, and in which are shown by way of illustration several specific embodiments. It is to be understood that other embodiments are contemplated and may be made without departing from the scope or spirit of the present disclosure. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise.

As used herein, "have", "having", "include", "including", "comprise", "comprising" or the like are used in their open ended sense, and generally mean "including, but not limited to". It will be understood that "consisting essentially of", "consisting of", and the like are subsumed in "comprising," and the like.

In this disclosure:

"backfill materials" or "backfill layers" refers to layers of materials that fill in irregular or structured surfaces to produce a new surface that may be used as a base to build additional layered elements and is thermally stable;

"bake-out" refers to the process of substantially removing sacrificial material present in a layer by pyrolysis, combustion, sublimation, or vaporization while leaving thermally stable materials substantially intact (backfill, substrate);

"bake-out temperature" refers to the maximum temperature reached during the process of substantially removing sacrificial materials in a layer by pyrolysis or combustion while leaving thermally stable materials substantially intact (backfill, substrate);

"combust" or "combustion" refers to a process of heating a layer that comprises organic materials in an oxidizing atmosphere so that organic materials undergo a chemical reaction with the oxidant;

"solvent" refers to organic or aqueous liquid that is capable of dissolving, dispersing or suspending the materials described herein, e.g., organosilicon compounds, nanoparticles, polymers, sacrificial materials, etc.

"nanostructures" refers to features that range from about 1 nm to about 2000 nm in their longest dimension and includes microstructures;

"pyrolyze" or "pyrolysis" refers to a process of heating a sacrificial layer in an inert atmosphere so that organic materials in the article decompose;

"structured surface" refers to a surface that includes periodic, quasi-periodic or random engineered microstructures, nanostructures, and/or hierarchical structures that can be in a regular pattern or random across the surface;

"thermally stable" refers to materials that remain substantially intact during the removal of sacrificial materials;

"polysiloxanes" refers to highly branched oligomeric or polymeric organosilicon compounds and may include carbon-carbon and/or carbon-hydrogen bonds while still being considered as inorganic compounds; and "migratable species" refers to a molecular species that moves from the backfill layer to the sacrificial layer. For example, a migratable species might include silanes, siloxanes, polysiloxanes or other organosilicon compounds.

The present disclosure relates to lamination transfer films for forming articles with engineered voids and method of forming these lamination transfer films. These transfer films can be laminated to a desired substrate (like glass) and "baked out" to reveal a unique bridged nanostructure defining "engineered voids". The bridge element of these bridged nanostructures can be formed, for example, by migration of a molecular species from a backfill layer to a sacrificial layer. Control over migration of the molecular species (e.g., low molecular weight polysiloxanes) into the sacrificial resin can be altered by changing the chemical and physical properties of the sacrificial template and/or the molecular species (e.g., polysiloxane formulation). A high level of migration of the migratable species into the sacrificial polymer leads to the formation of the unique "bridge" structure following "bake out" of the transfer tape on the desired substrate. Alternatively, the migratable molecular species forming the bridge feature can be placed in the transfer film without the need for migration. The kinetics of siloxane curing and thermal decomposition of the microstructured sacrificial polymer both influence the morphology of the bridge. The bridge forms independently of the inorganic nanostructure that is defined by the sacrificial template layer, as the organic polymer decomposes. The space in between the bridge and the engineered nanostructure forms "engineered voids" whose shapes are defined by the bounds of the engineered nanostructure and the bridge. In some embodiments, the distribution of the migrated species in the sacrificial polymer layer determines the morphology of the final structure. Control of various aspects of bridge formation has also been demonstrated herein. The articles and process described herein may lead to numerous applications in the field of engineered ceramics. For example, some nanostructured surfaces suffer from poor durability, such as, for example, anti-reflective surfaces. The durability of nanostructured coatings can be improved by covering them with a thin inorganic mechanical barrier coating, such as the bridge structures described herein. Also, the refractive index of both the bridge and the nanostructured coating may be independently changed, leading to applications in light management. The voids can be continuous or discontinuous across the entire sample area. While the present disclosure is not so limited, an appreciation of various aspects of the disclosure will be gained through a discussion of the examples provided below.

Figure 1:
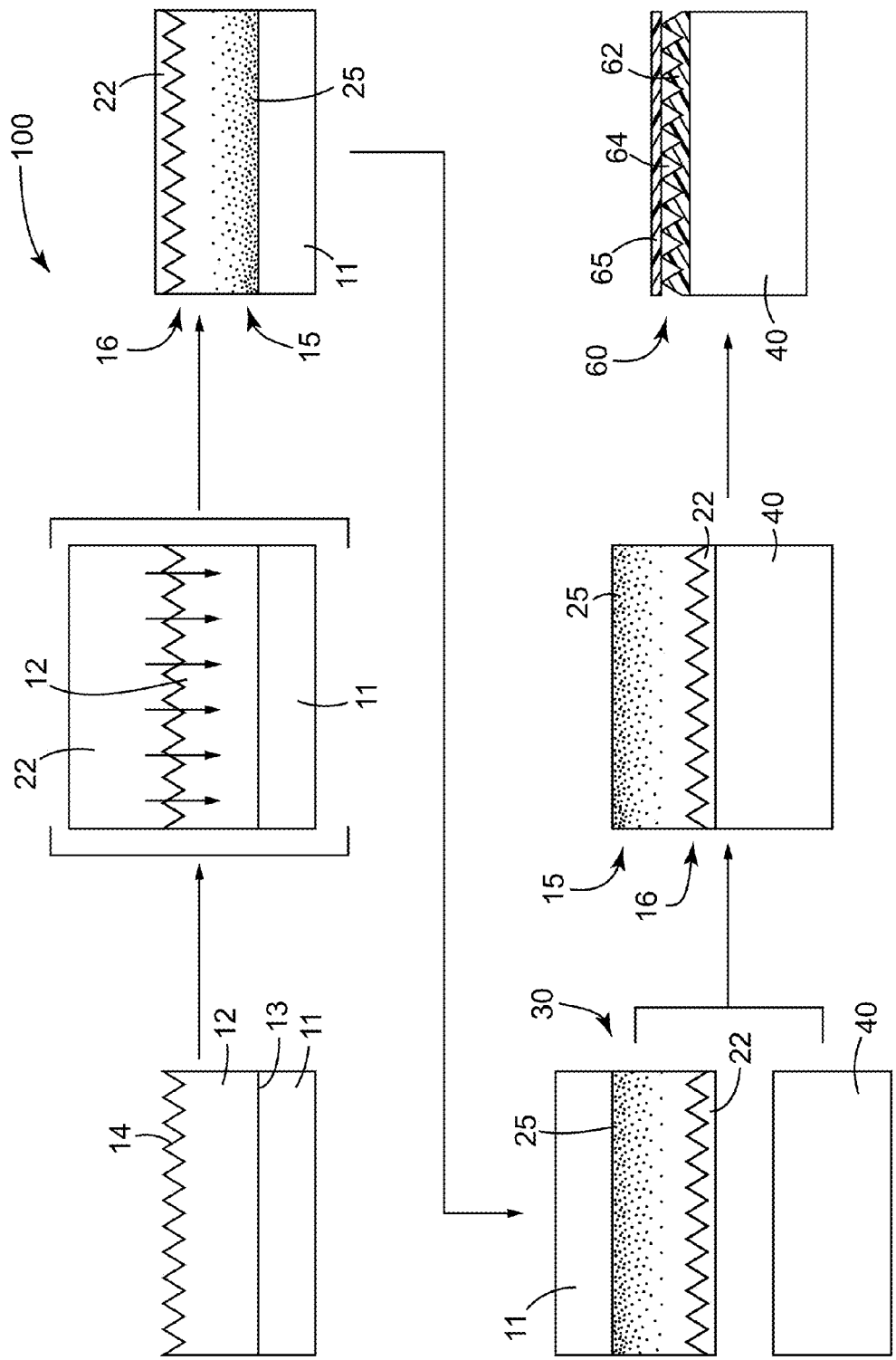
FIG. 1 is a schematic process flow diagram of an illustrative method of forming the transfer film and final bridged nanostructure.
Figure 2:
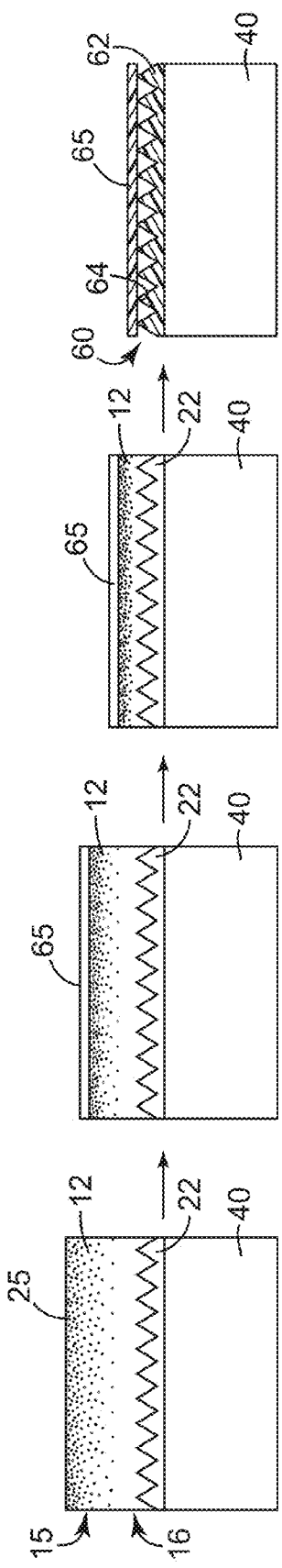
FIG. 2 is a schematic process flow diagram of an illustrative bake out method of forming the final bridged nanostructure.
Figure 3:
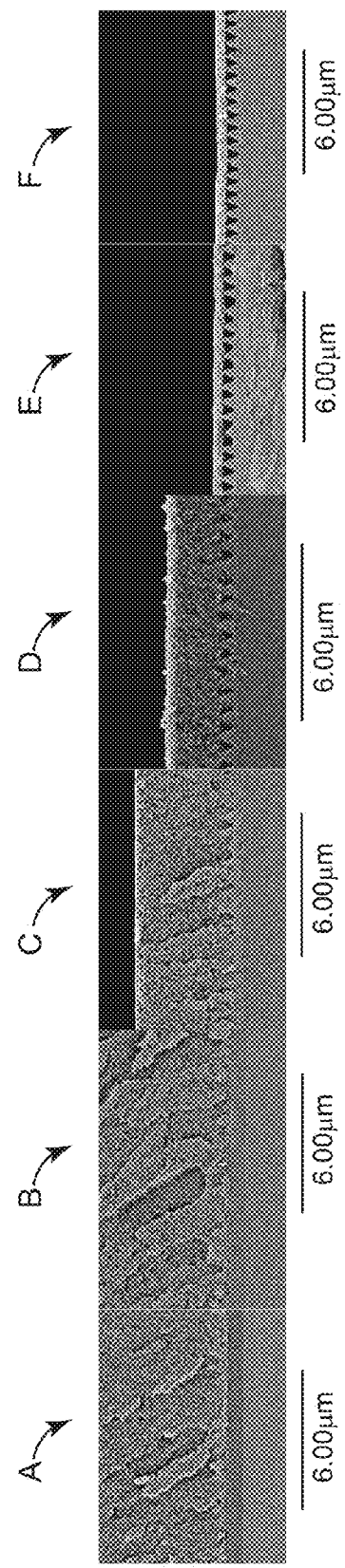
FIG. 3 illustrates six cross-sectional SEM micrographs of an illustrative bake out forming the final bridged nanostructure.

FIG. 1 is a schematic process flow diagram of an illustrative method 100 of forming the transfer film 30 and final bridged nanostructure 60. FIG. 2 is a schematic process flow diagram of an illustrative bake out method of forming the final bridged nanostructure 60. FIG. 3 illustrates six cross-sectional SEM micrographs (1-6) of an illustrative bake out forming the final bridged nanostructure.

This method 100 includes applying a thermally stable backfill coating solution 22 to a structured surface 14 of a sacrificial template layer 12 and allowing a migratable species (illustrated by the arrows) to migrate from the thermally stable backfill layer 22 to the sacrificial template layer 12, forming the transfer film 30. The thermally stable backfill layer 22 conforms to the structured surface 14 of the sacrificial template layer 12.

The thermally stable backfill solution can be coated onto the structured surface 14 and any solvent or portion of solvent removed and optionally cured to form the thermally stable backfill layer 22. Preferably, after removal of solvent and curing, the thermally stable material substantially planarizes the sacrificial template layer. Substantial planarization means that the amount of planarization (P %), as defined by Equation 1, is greater than 50%, or greater than 75%, or preferably greater than 90%.

$$P\% = (1 - (t_1/h_1)) * 100 \qquad (1)$$

where $t_1$ is the relief height of a surface layer and $h_1$ is the feature height of features covered by the surface layer, as further disclosed in P. Chiniwalla, *IEEE Trans. Adv. Packaging* 24(1), 2001, 41.

The sacrificial template layer 12 can be on a carrier layer 11 (i.e., liner) having a releasable surface. In other embodiments, a carrier layer 11 is not present. The liner or carrier layer 11 can be implemented with a thermally stable flexible film providing mechanical support for the other layers. The liner 11 has a releasable surface, meaning the liner 11 allows for release of a material applied to the releasable surface. The carrier layer 11 should be thermally stable above 70° C., or alternatively above 120° C., without adversely affecting either the sacrificial layer or the backfill layer. One example of a carrier film is polyethylene terephthalate (PET).

The support substrate or carrier layer 11 (described herein) can be embodied as a flexible film providing mechanical support for the other layers. One example of a carrier film 11 is polyethylene terephthalate (PET). Various polymeric film substrates comprised of various thermosetting or thermoplastic polymers are suitable for use as the support substrate. The carrier may be a single layer or multi-layer film. Illustrative examples of polymers that may be employed as the carrier layer film include (1) fluorinated polymers such as poly(chlorotrifluoroethylene), poly(tetrafluoroethylene-cohexafluoropropylene), poly(tetrafluoroethylene-co-perfluoro(alkyl)vinylether), poly(vinylidene fluoride-cohexafluoropropylene); (2) ionomeric ethylene copolymers poly(ethylene-co-methacrylic acid) with sodium or zinc ions such as SURLYN-8920 Brand and SURLYN-9910 Brand available from E. I. duPont Nemours, Wilmington, Del.; (3) low density polyethylenes such as low density polyethylene; linear low density polyethylene; and very low density polyethylene; plasticized vinyl halide polymers such as plasticized poly(vinychloride); (4) polyethylene copolymers including acid functional polymers such as poly(ethylene-co-acrylic acid) "EAA", poly(ethylene-co-methacrylic acid) "EMA", poly(ethylene-co-maleic acid), and poly(ethylene-co-fumaric acid); acrylic functional polymers such as poly(ethylene-co-alkylacrylates) where the alkyl group is methyl, ethyl, propyl, butyl, et cetera, or CH3 (CH2)n- where n is 0 to 12, and poly(ethylene-co-vinylacetate) "EVA"; and (5) (e.g.) aliphatic polyurethanes. The carrier layer can be an olefinic polymeric material, typically comprising at least 50 wt % of an alkylene having 2 to 8 carbon atoms with ethylene and propylene being most commonly employed. Other carrier layers include for example poly(ethylene naphthalate), polycarbonate, poly(meth)acrylate (e.g., polymethyl methacrylate or "PMMA"), polyolefms (e.g., polypropylene or "PP"), polyesters (e.g., polyethylene terephthalate or "PET"), polyamides, polyimides, phenolic resins, cellulose diacetate, cellulose triacetate (TAC), polystyrene, styrene-acrylonitrile copolymers, cyclic olefin copolymers, epoxies, and the like. In some embodiments, the carrier layer can include paper, release-coated paper, nonwovens, wovens (fabric), metal films, and metal foils. In some embodiments, the carrier layer can include sacrificial materials that can remain on the transfer film during the bake out process. For example, the carrier film can include a PET layer on a PMMA release layer where the release layer remains on the transfer film following release from the PET layer. Sacrificial materials (such as the PMMA release layer), can be pyrolyzed by subjecting them to thermal conditions that can vaporize substantially all of the organic material present in the sacrificial layers. These sacrificial layers can also be subjected to combustion to burn out all of the organic material present in the sacrificial layer. Typically, a clear, high-purity polymer, such as poly(methyl methacrylate), poly(ethyl acrylate-co-methyl methacrylate), can be used as the sacrificial material. Useful sacrificial materials leave very low organic residuals (ash) after pyrolysis or combustion at the bake out temperature.

The sacrificial template layer 12 can be nanostructured by any useful method such as a continuous cast and cure process or embossed to produce the structured surface 14. In many embodiments a planar first surface 13 opposes the structured second surface 14. The releasable surface of the carrier layer 11 can contact the planar first surface 13. The sacrificial template layer 12 can be substantially planarized using the backfill layer 22.

In many embodiments, a portion 15 of the sacrificial template layer 12 proximate the first surface 13 has a greater concentration of a thermally stable molecular species than a portion 16 of the sacrificial template layer proximate the second surface 14. In many of these embodiments, the sacrificial template layer 12 has a gradient 25 of thermally stable molecular species and the gradient 25 is a concentration of thermally stable molecular species that changes as a function of a distance (normal to a major surface) away from the structured surface 14 along a thickness direction of the sacrificial template layer 12. In many of these embodiments, the concentration of thermally stable molecular species that migrated into the sacrificial template layer 12 increases as a distance from the structured surface 14. Preferably the concentration of migrated thermally stable molecular species within the sacrificial template layer 12 is greatest about or at the first surface 13.

The transfer film 30 can be laminated to a receptor substrate 40 and exposed to a heating or baking out process to remove the sacrificial template layer 12 and to form engineered voids defined by a bridging layer 65 and the structured surface 64 of the thermally stable backfill layer 62. In some embodiments, an optional sacrificial adhesive layer (not shown) is applied to the backfill layer 22 or to receptor substrate 40, prior to lamination.

Examples of receptor substrates 40 include glass such as display mother glass (e.g., backplane mother glass), display cover glass, lighting mother glass, architectural glass, roll glass, and flexible glass. An example of flexible roll glass is commercially available under the trade designation WILLOW glass from Corning Incorporated. Other examples of receptor substrates include metals such as metal parts, sheets and foils. Yet other examples of receptor substrates include sapphire, silicon, silica, and silicon carbide.

Display backplane mother glass receptor substrates can optionally include a buffer layer on a side of the receptor substrate to which a lamination transfer film is applied. Examples of buffer layers are described in U.S. Pat. No. 6,396,079, which is incorporated herein by reference as if fully set forth. One type of buffer layer is a thin layer of $SiO_2$, as described in K. Kondoh et al., J. of Non-Crystalline Solids 178 (1994) 189-98 and T-K. Kim et al., Mat. Res. Soc. Symp. Proc. Vol. 448 (1997) 419-23, both of which are incorporated herein by reference as if fully set forth.

A particular advantage of the transfer films and methods described herein is the ability to impart structure to receptor surfaces with large surfaces, such as display mother glass or architectural glass. Semiconductor patterning methods exist for creating nanopatterns that can be complex, however these methods are generally slow, complicated, expensive, and limited to the size of a single wafer (e.g., around 300 mm diameter). Step and repeat stamping methods such as nanoimprint lithography has been used to produce nanopatterns over larger areas than semiconductor patterning methods, however these methods are still generally slow, expensive, and complicated, often requiring several conventional photolithographic process steps such as resist coating, reactive ion etching, and resist stripping.

The transfer films and method described herein overcomes the above mentioned size constraints and complexity by utilizing a combination of roll-to-roll processing and a cylindrical master template element. These methods also obviate the need for photolithographic process steps. The transfer films described herein have large enough dimensions to be used to impart nanostructures over, at least, entire large digital display substrates (e.g., a 55 inch diagonal AMOLED HDTV, with dimensions of 52 inches wide by 31.4 inches tall), for example.

The bridging layer 65 is formed from the thermally stable molecular species 25 within the sacrificial template layer 12 and the bridging layer 65 is disposed on the structured surface 64. In many embodiments the bridging layer 65 is formed from the gradient of thermally stable molecular species 25 within the sacrificial template layer 12.

As described and illustrated in FIG. 2 and FIG. 3, the sacrificial template layer 12 can be cleanly baked out leaving a bridging layer 65 disposed on the structured surface 64 and defining engineered voids. These figures illustrate that the sacrificial template layer 12 is capable of being baked out while leaving engineered voids defined by a bridging layer 65 and the structured surface 64 of the thermally stable backfill layer 62. The bridging layer 65 is formed from the thermally stable molecular species 25 within the sacrificial template layer 12 and the bridging layer 65 is disposed on the structured surface 64.

FIG. 3 illustrates six cross-sectional SEM micrographs (A, B, C, D, E, F) of an illustrative bake out forming the final bridged nanostructure. These six photos A-F have been aligned so that the surface of the receptor substrate is coplanar across the page. Each photo is taken at specified temperature increasing across the page from left to right. For example, A is taken at a temperature of 300 degrees centigrade, B is taken at a temperature of 350 degrees centigrade, C is taken at a temperature of 400 degrees centigrade, D is taken at a temperature of 450 degrees centigrade, E is taken at a temperature of 500 degrees centigrade after 20 minutes, and F is taken at a temperature of 500 degrees centigrade after 40 minutes.

The bridge structure forms independently of the inorganic nanostructure that is defined by the sacrificial template layer, and gradually settles on top of the nanostructure as the organic polymer decomposes. The space in between the bridge and the engineered nanostructure forms "engineered voids" whose shapes are defined by the bounds of the engineered nanostructure and the bridge. As illustrated in FIG. 3, a large volume of sacrificial template layer decomposes during the bake out process as compared to the volume of bridge remaining. In some embodiments, the thickness of the sacrificial template layer is at least 2 times or at least 5 times, or at least 10 times the thickness of the resulting bridge structure.

Figure 4:
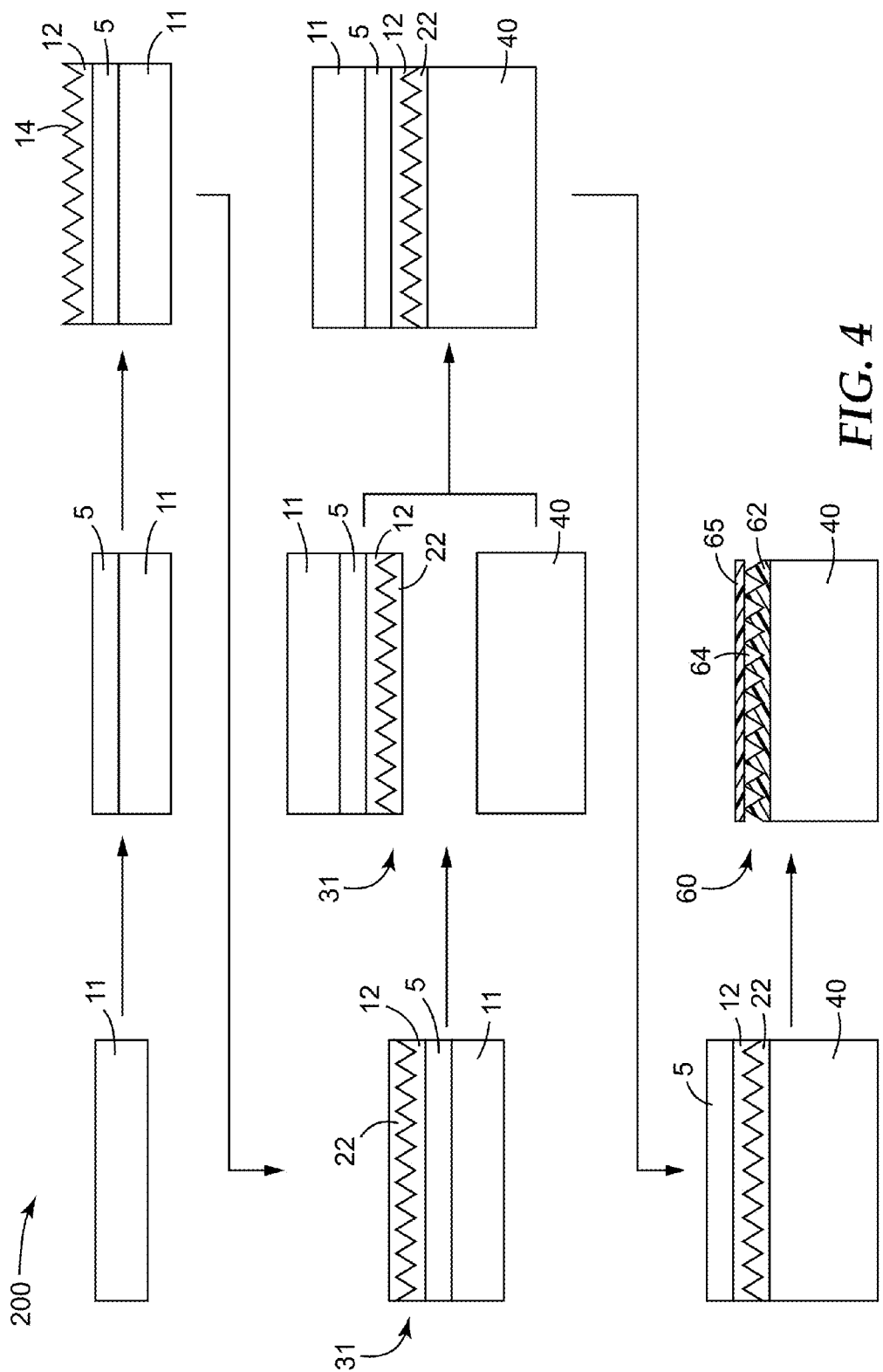
FIG. 4 is a schematic process flow diagram of another illustrative method of forming the transfer film and final bridged nanostructure.

FIG. 4 is a schematic process flow diagram of another illustrative method 200 of forming the transfer film 31 and final bridged nanostructure 60. The method 200 of forming a transfer film 31 includes forming a first layer 5 which may include sacrificial material and/or a thermally stable molecular species and disposing a sacrificial template layer 12 onto the first layer 5. The sacrificial template layer 12 has a first surface 13 contacting the first layer 5 and an opposing second surface 14 being a structured surface.

The first layer 5 or the sacrificial template layer 12 can be on a carrier layer 11 (i.e., liner) having a releasable surface. In other embodiments, a carrier layer 11 is not present. The sacrificial template layer 12 can be nanostructured by any useful method such as a continuous cast and cure process or embossed to produce the structured surface 14. In many embodiments a planar first surface 13 opposes the structured second surface 14. The sacrificial template layer 12 can be substantially planarized using a backfill layer 22.

The method includes applying the thermally stable backfill layer 22 to a structured surface 14 of a sacrificial template layer 12, to planarize the structured surface 14, as described above. The thermally stable backfill layer 22 conforms to the structured surface 14 of the sacrificial template layer 12 and the thermally stable molecular species may not migrate from the thermally stable backfill layer 22 or from the sacrificial template layer 12. The first layer 5 can be separated from the thermally stable backfill layer 22 by the sacrificial template layer 12.

In some embodiments the sacrificial template layer 12 includes the thermally stable molecular species and/or inorganic materials such as, for example, inorganic nanomaterials and may or may not include the first layer 5. The inorganic nanomaterials can be present in a sacrificial layer 12 and the sacrificial material can be cleanly baked out leaving a densified layer of nanomaterials. In some embodiments, the densified layer of nanomaterials can completely or partially fuse into a glass-like material. The densified layer of nanomaterials can have substantial void volume. The densified layer of nanomaterials can be transparent and can have a high index of refraction compared to surrounding layers of the disclosed transfer films. Inorganic nanoparticles can be present in one or more embedded layers, each layer having a different index of refraction influenced by the type and concentration of nanoparticles present in the layer.

The transfer film 31 can be laminated to a receptor substrate 40 and exposed to a heating or baking out process to remove the sacrificial template layer 12 and to form engineered voids defined by a bridging layer 65 and the structured surface 64 of the thermally stable backfill layer 62. In these embodiments, the bridging layer 65 is formed from the thermally stable molecular species in layer 5 and the bridging layer 65 is disposed on the structured surface 62.

In many of these embodiments, the sacrificial template layer 12 includes a thermally stable molecular species in layer 5 and the thermally stable molecular species is separated from the structured surface 14 of the sacrificial template layer 12 by a layer of sacrificial material. In many of these embodiments, the layer of sacrificial material consists essentially of sacrificial material. For example the layer of sacrificial material is at least 99 wt % sacrificial material, or at least 99.5 wt % sacrificial material, or at least 99.9 wt % sacrificial material.

Figure 5:
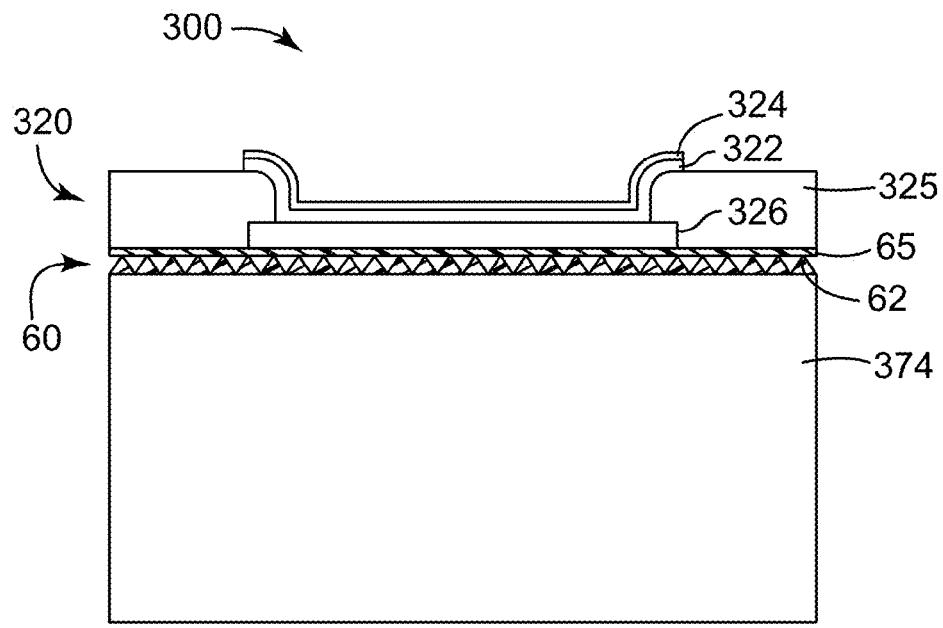
FIG. 5 is a schematic cross-sectional diagram of an illustrative bottom emitting OLED article including the bridged nanostructure described herein.

FIG. 5 is a schematic cross-sectional diagram of an illustrative bottom emitting OLED (i.e., organic light emitting diode) article 300 including the bridged nanostructure 60 described herein. This bottom emitting OLED article 300 includes a light transparent support layer 374 and a nanostructured layer 60 on the support substrate 374. In many embodiments the light transparent support layer 374 is glass. The nanostructured layer 60 can be placed in the bottom emitting OLED article 300 during fabrication of the bottom emitting OLED article 300 by using the transfer films and methods described herein.

The nanostructured layer 60 includes a structured surface layer 62 and a bridging layer 65 on the structured surface layer 62 and defining a plurality of engineered voids. An OLED structure 320 is disposed on the bridging layer 65, the OLED structure 320 includes an OLED layer 322 separating a top electrode 324 and a bottom electrode 326. The OLED structure 320 can include a pixel defining layer 325. The OLED structure 320 can include additional layers not illustrated, for example the OLED layer 322 may have two or more individual OLED layers forming the OLED layer 322.

The bridged nanostructure 60 can define a boundary of high refractive index material and low refractive index material forming the bottom emitting OLED article 300. In many embodiments, the structured surface layer 62 (and light transparent support layer 374) has a refractive index of 1.5 or less and the bridging layer 65 (and OLED layers in contact with the bridging layer 65) has a refractive index of 1.6 or greater. In OLED lighting displays and elements, the position and refractive index of each light transparent layer is adjusted to optimize the performance of the device.

Figure 6:
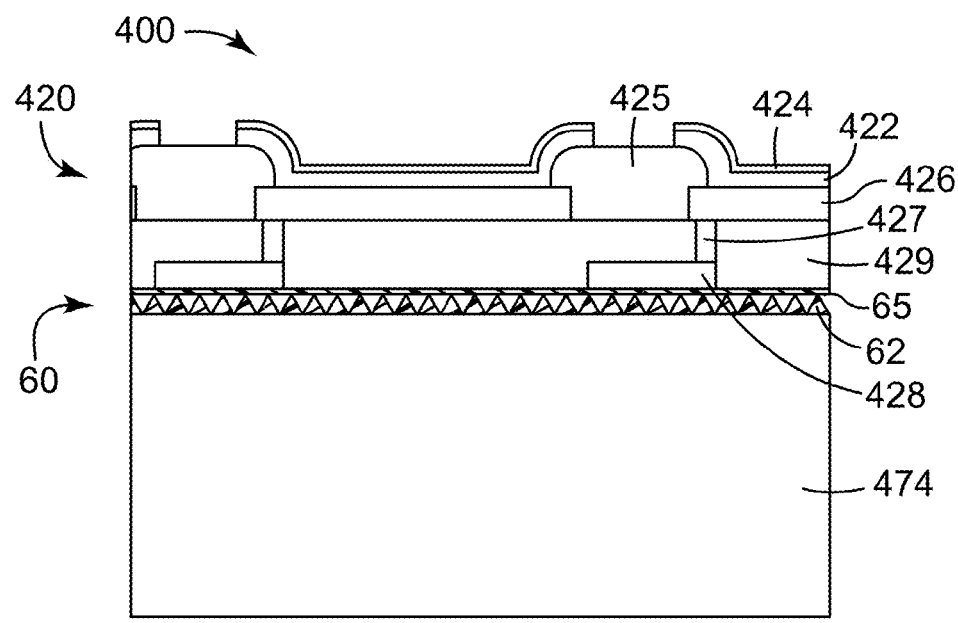
FIG. 6 is a schematic cross-sectional diagram of an illustrative bottom emitting AMOLED article including the bridged nanostructure described herein.

FIG. 6 is a schematic cross-sectional diagram of an illustrative bottom emitting AMOLED (i.e., active matrix OLED) article 400 including the bridged nanostructure 60 described herein. This bottom emitting AMOLED article 400 includes a light transparent support layer 474 and a nanostructured layer 60 on the support substrate 474. In many embodiments the light transparent support layer 474 is glass. The nanostructured layer 60 can be placed in the bottom emitting AMOLED article 400 during fabrication of the bottom emitting AMOLED article 400 by using the transfer films and methods described herein.

The nanostructured layer 60 includes a structured surface layer 62 and a bridging layer 65 on the structured surface layer 62 and defining a plurality of engineered voids. An AMOLED structure 420 is disposed on the bridging layer 65, the OLED structure 420 includes an AMOLED layer 422 separating a top electrode 424 and a bottom electrode 426. The AMOLED structure 420 can include a pixel defining layer 425. The bottom electrode 426 can be electrically coupled to pixel circuitry 428 through a via 427 in a planarization layer 429. The AMOLED structure 420 can include additional layers not illustrated, for example the AMOLED layer 422 may have two or more individual OLED layers forming the AMOLED layer 422.

The bridged nanostructure 60 can define a boundary of high refractive index material and low refractive index material forming the bottom emitting AMOLED article 400. In many embodiments, the structured surface layer 62 (and light transparent support layer 474) has a refractive index of 1.5 or less and the bridging layer 65 (and AMOLED layers in contact with the bridging layer 65) has a refractive index of 1.6 or greater. In AMOLED displays and elements, the position and refractive index of each light transparent layer is adjusted to optimize the performance of the device.

Figure 7:
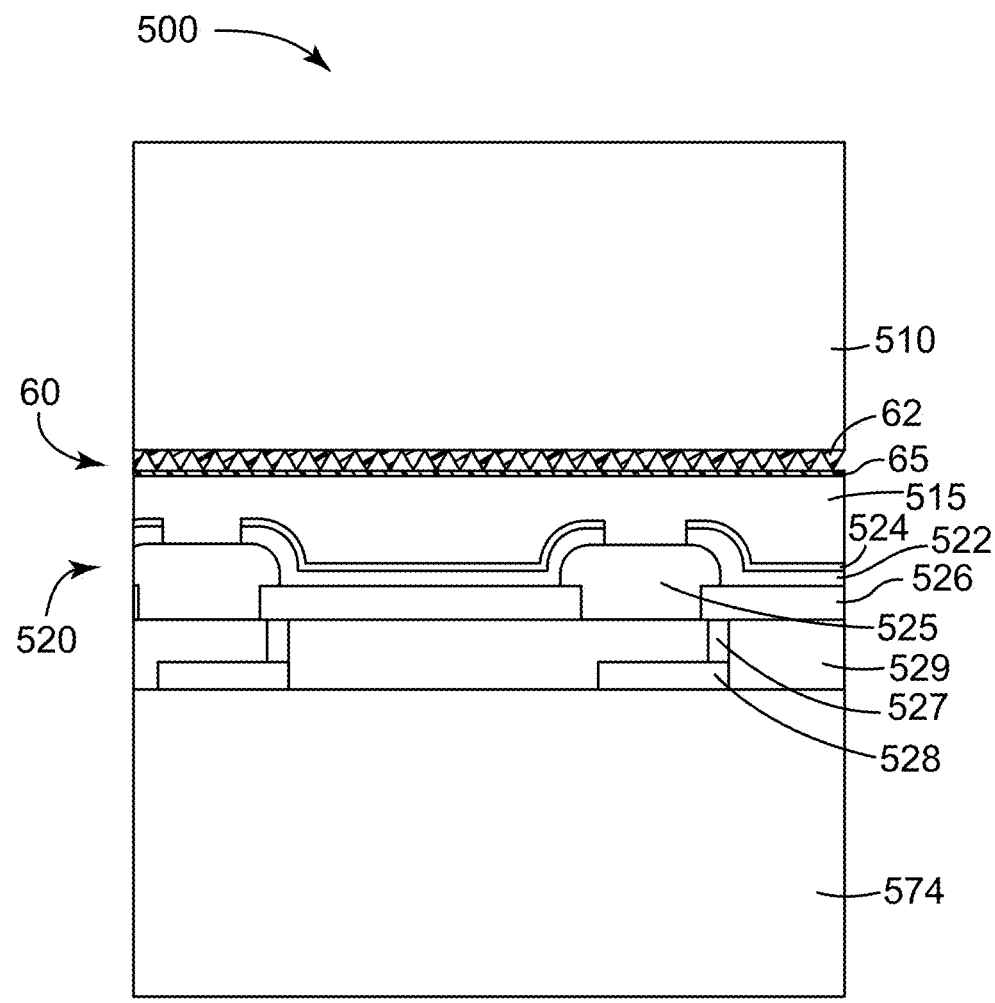
FIG. 7 is a schematic cross-sectional diagram of an illustrative top emitting AMOLED article including the bridged nanostructure described herein.

FIG. 7 is a schematic cross-sectional diagram of an illustrative top emitting AMOLED article 500 including the bridged nanostructure 60 described herein. The top emitting AMOLED 500 includes a support layer 575 and an AMOLED structure 520 disposed on the bridging layer 65. The AMOLED structure 520 includes an OLED layer 522 separating a top electrode 524 and a bottom electrode 526 and an optional optical coupling and planarizing layer 515 is disposed on the top electrode 524. The AMOLED structure 520 can include a pixel defining layer 525. The bottom electrode 526 can be electrically coupled to pixel circuitry 528 through a via 527 in a planarization layer 529. The AMOLED structure 520 can include additional layers not illustrated, for example the AMOLED layer 522 may have two or more individual OLED layers forming the AMOLED layer 522. The AMOLED structure 520 and/or the light transparent layer 510 can include additional layers such as a color filter layer.

In many embodiments the nanostructured layer 60 is optically coupled to the AMOLED structure 520 via the optical coupling and planarizing layer 515. This optically coupled structure provides color uniformity and light extraction. In some embodiments the nanostructured layer 60 is not optically coupled to the AMOLED structure 520 and is adjacent to the AMOLED structure 520. This uncoupled structure can provide color uniformity and light distribution without light extraction. The nanostructured layer 60 includes a structured surface layer 62 and a bridging layer 65 on the structured surface layer 62 and defining a plurality of engineered voids. The bridging layer 65 can be fixed to the optical coupling and planarizing layer 515. A light transparent layer 510 is disposed on the structured surface layer 62.

The bridged nanostructure 60 can define a boundary of high refractive index material and low refractive index material forming the top emitting AMOLED article 500. In many embodiments, the structured surface layer 62 (and light transparent support layer 510) has a refractive index of 1.5 or less and the bridging layer 65 (and the optically coupling and planarizing layer 515) has a refractive index of 1.6 or greater. In AMOLED displays and elements, the position and refractive index of each light transparent layer is adjusted to optimize the performance of the device.

Thermally Stable Material

A thermally stable material is utilized to form the thermally stable backfill layer of the transfer film. The thermally stable material includes thermally stable molecular species. It is understood that the thermally stable material and the thermally stable molecular species includes precursor materials that either are or transform into materials that remain substantially intact during the removal of sacrificial materials, such as during "bake out" or pyrolysis.

Materials that may be used for the backfill include polysiloxane resins, polysilazanes, polyimides, silsesquioxanes of bridge or ladder-type, silicones, and silicone hybrid materials and many others. Exemplary polysiloxane resins are available under the trade designation PERMANEW 6000, available from California Hardcoating Company, Chula Vista, Calif. These molecules typically have an inorganic component which leads to high dimensional stability, mechanical strength, and chemical resistance, and an organic component that helps with solubility and reactivity.

In many embodiments the thermally stable molecular species includes silicon, hafnium, strontium, titanium or zirconium. In some embodiments the thermally stable molecular species includes a metal, metal oxide or metal oxide precursor. Metal oxide precursors may be used in order to act as an amorphous "binder" for inorganic nanoparticles, or they may be used alone.

In many embodiments, the materials useful in the current invention belong to a class of the highly branched organosilicon oligomers and polymers of a general formula (as below) which can be further reacted to form crosslinked networks by homo-condensation of Si—OH groups, hetero-condensation with the remaining hydrolyzable groups (e.g. alkoxy), and/or by reactions of the functional organic groups (e.g. ethylenically unsaturated). This class of materials is derived primarily from organosilanes of a general formula:

$$R_xSiZ_{4-x},$$

wherein

R is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these.

Z is a hydrolyzable group, such as halogen (containing the elements F, Br, Cl, or I), $C_1$-$C_{20}$ alkoxy, $C_5$-$C_{20}$ aryloxy, and/or combinations of these.

The majority of the composition may consist of $RSiO_{3/2}$ units thus the class of materials is often called silsesquioxanes (or T-resins), however they may also contain mono-($R_3Si$—$O_{1/2}$), di-($R_2SiO_{2/2}$) and tetrafunctional groups (Si—$O_{4/2}$). Organically-modified disilanes of the formula:

$$Z_{3-n}R_nSi-Y-Si\ R_nZ_{3-n}$$

are often used in the hydrolyzable compostions to further modify the properties of the materials (to form the so-called bridged silsesquioxanes), the R and Z groups are defined above. The materials can be further formulated and reacted with metal alkoxides ($M(OR)_m$) to form metallo-silsesquioxanes.

In many embodiments the highly branched organosilicon oligomers and polymers of a general formula:

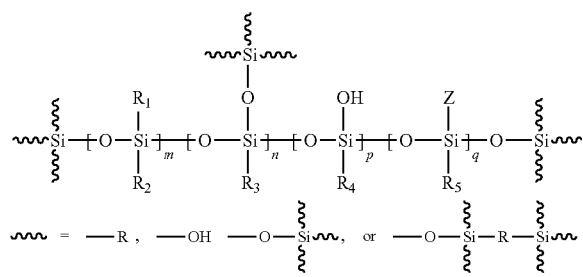

$R_1$ is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocyclo alkyl group, and/or combinations of these;

$R_2$ is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these;

$R_3$ is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these;

$R_4$ is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these;

$R_5$ is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these;

Z is a hydrolyzable group, such as halogen (containing the elements F, Br, Cl, or I), $C_1$-$C_{20}$ alkoxy, C-$C_{20}$ aryloxy, and/or combinations of these.

m is an integer from 0 to 500;
n is an integer from 1 to 500;
p is an integer from 0 to 500;
q is an integer from 0 to 100.

As used herein, the term "substituted" refers to one substituted with at least a substituent selected from the group consisting of a halogen (containing the elements F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, alkyl group, a $C_2$ to $C_{20}$ alkenyl group, a $C_2$ to $C_{20}$ alkynyl group, $C_6$ to $C_{30}$ aryl group, a $C_7$ to $C_{13}$ arylalkyl group, a $C_1$ to $C_4$ oxyalkyl group, a $C_1$ to $C_{20}$ heteroalkyl group, a $C_3$ to $C_{20}$ heteroarylkyl group, a $C_3$ to $C_{30}$ cycloalkyl group, a $C_3$ to $C_{15}$ cycloalkenyl group, a $C_6$ to $C_{15}$ cycloalkynyl group, a heterocycloalkyl group, and a combination thereof, instead of hydrogen of a compound.

The resulting highly branched organosilicon polymer has a molecular weight in a range from 150 to 300,000 Da or preferably in a range from 150 to 30,000 Da.

Preferably, the thermally stable backfill contains the reaction product of the hydrolysis and condensation of a methyltriethoxysilane precursor in a polar solvent. After synthesis, the resulting polymer preferably has a molecular weight of nominally less than 30,000 Da. The thermally stable backfill solution also preferably includes less than fifty percent by weight silica nanoparticles nominally of a size between 10-50 nanometers.

The thermally stable compositions described herein preferably comprise inorganic nanoparticles. These nanoparticles can be of various sizes and shapes. The nanoparticles can have an average particle diameter less than about 1000 nm, less than about 100 nm, less than about 50 nm, or less than about 35 nm. The nanoparticles can have an average particle diameter from about 3 nm to about 50 nm, or from about 3 nm to about 35 nm, or from about 5 nm to about 25 nm. If the nanoparticles are aggregated, the maximum cross sectional dimension of the aggregated particle can be within any of these ranges, and can also be greater than about 100 nm. "Fumed" nanoparticles, such as silica and alumina, with primary size less than about 50 nm, may also be used, such as CAB-OSPERSE PG 002 fumed silica, CAB-O-SPERSE 2017A fumed silica, and CAB-OSPERSE PG 003 fumed alumina, available from Cabot Co. Boston, Mass. Their measurements can be based on transmission electron microscopy (TEM). Nanoparticles can be substantially fully condensed. Fully condensed nanoparticles, such as the colloidal silicas, typically have substantially no hydroxyls in their interiors. Non-silica containing fully condensed nanoparticles typically have a degree of crystallinity (measured as isolated particles) greater than 55%, preferably greater than 60%, and more preferably greater than 70%. For example, the degree of crystallinity can range up to about 86% or greater. The degree of crystallinity can be determined by X-ray diffraction techniques. Condensed crystalline (e.g. zirconia) nanoparticles have a high refractive index whereas amorphous nanoparticles typically have a lower refractive index. Various shapes of the inorganic or organic nanoparticles may be used, such as sphere, rod, sheet, tube, wire, cube, cone, tetrahedron, and the like.

The size of the particles is generally chosen to avoid significant visible light scattering in the final article. The nanomaterial selected can impart various optical properties (i.e refractive index, birefringence), electrical properties (e.g conductivity), mechanical properties (e.g toughness, pencil hardness, scratch resistance) or a combination of these properties. It may be desirable to use a mix of organic and inorganic oxide particle types to optimize an optical or material property and to lower total composition cost.

Examples of suitable inorganic nanoparticles include metal nanoparticles or their respective oxides, including the elements zirconium (Zr), titanium (Ti), hafnium (Hf), aluminum (Al), iron (Fe), vanadium (V), antimony (Sb), tin (Sn), gold (Au), copper (Cu), gallium (Ga), indium (In), chromium (Cr), manganese (Mn), cobalt (Co), nickel (Ni), zinc (Zn), yttrium (Y), niobium (Nb), molybdenum (Mo), technetium (Te), ruthenium (Ru), rhodium (Rh), palladium (Pd), silver (Ag), cadmium (Cd), lanthanum (La), tantalum (Ta), tungsten (W), rhenium (Rh), osmium (Os), iridium (Ir), platinum (Pt), and any combinations thereof.

In a preferred embodiment, nanoparticles of zirconium oxide (zirconia) are used. Zirconia nanoparticles can have a particle size from approximately 5 nm to 50 nm, or 5 nm to 15 nm, or 10 nm. Zirconia nanoparticles can be present in the durable article or optical element in an amount from 10 to 70 wt %, or 30 to 50 wt %. Zirconias for use in materials of the invention are commercially available from Nalco Chemical Co. (Naperville, Ill.) under the product designation NALCO OOSSOO8 and from Buhler AG Uzwil, 20 Switzerland under the trade designation "Buhler zirconia Z-WO sol". Zirconia nanoparticle can also be prepared such as described in U.S. Pat. No. 7,241,437 (Davidson et al.) and U.S. Pat. No. 6,376,590 (Kolb et al.). Titania, antimony oxides, alumina, tin oxides, and/or mixed metal oxide nanoparticles can be present in the durable article or optical element in an amount from 10 to 70 wt %, or 30 to 50 wt %. Densified ceramic oxide layers may be formed via a "sol-gel" process, in which ceramic oxide particles are incorporated into a gelled dispersion with a precursor of at least one modifying component followed by dehydration and firing, as described in U.S. Pat. No. 5,453,104 (Schwabel). Mixed metal oxide for use in materials of the invention are commercially available from Catalysts & Chemical Industries Corp., (Kawasaki, Japan) under the product designation OPTOLAKE.

Other examples of suitable inorganic nanoparticles include elements and alloys known as semiconductors and their respective oxides such as silicon (Si), germanium (Ge), silicon carbide (SiC), silicon germanide (SiGe), aluminium nitride (AlN), aluminium phosphide (AlP), boron nitride (BN), boron carbide ($B_4C$), gallium antimonide (GaSb), indium phosphide (InP), gallium arsenide nitride (GaAsN), gallium arsenide phosphide (GaAsP), indium aluminum arsenide nitride (InAlAsN), zinc oxide (ZnO), zinc selenide (ZnSe), zinc sulfide (ZnS), zinc telluride (ZnTe), mercury zinc selenide (HgZnSe), lead sulfide (PbS), lead telluride (PbTe), tin sulfide (SnS), lead tin telluride (PbSnTe), thallium tin telluride ($Tl_2SnTe_5$), zinc phosphide ($Zn_3P_2$), zinc arsenide ($Zn_3As_2$), zinc antimonide ($Zn_3Sb_2$), lead(II) iodide ($PbI_2$), copper(I) oxide ($Cu_2O$).

Silicon dioxide (silica) nanoparticles can have a particle size from 5 nm to 75 nm or 10 nm to 30 nm or 20 nm. Silica nanoparticles are typically in an amount from 10 to 60 wt.-%. Typically the amount of silica is less than 40 wt %. Suitable silicas are commercially available from Nalco Chemical Co. (Naperville, Ill.) under the trade designation NALCO COLLOIDAL SILICAS. For example, silicas 10 include NALCO trade designations 1040, 1042, 1050, 1060, 2327 and 2329. the organosilica under the product name IPA-ST-MS, IPA-ST-L, IPA-ST, IPA-ST-UP, MA-ST-M, and MAST sols from Nissan Chemical America Co. Houston, Tex. and the SNOWTEX ST-40, ST-50, ST-20L, ST-C, ST-N, ST-O, ST-OL, ST-ZL, ST-UP, and ST-OUP, also from Nissan Chemical America Co. Houston, Tex. Suitable fumed silicas include for example, products sold under the tradename, AEROSIL series OX-50, -130, -150, and -200 available from DeGussa AG, (Hanau, Germany), and CAB-O-SPERSE 2095, CAB-O-SPERSE A105, CAB-O-SIL M5 available from Cabot Corp. (Tuscola, Ill.). The weight ratio of polymerizable material to nanoparticles can range from about 30:70, 40:60, 50:50, 55:45, 60:40, 70:30, 80:20 or 90:10 or more. The preferred ranges of weight percent of nanoparticles range from about 10 wt % to about 60% by weight, and can depend on the density and size of the nanoparticle used.

Within the class of semiconductors include nanoparticles known as "quantum dots," which have interesting electronic and optical properties that can be used in a range of applications. Quantum dots can be produced from binary alloys such as cadmium selenide, cadmium sulfide, indium arsenide, and indium phosphide, or from ternary alloys such as cadmium selenide sulfide, and the like. Companies that sell quantum dots include Nanoco Technologies (Manchester, UK) and Nanosys (Palo Alto, Calif.).

Examples of suitable inorganic nanoparticles include elements known as rare earth elements and their oxides, such as lanthanum (La), cerium ($CeO_2$), praseodymium ($Pr_6O_{11}$), neodymium ($Nd_2O_3$), samarium ($Sm_2O_3$), europium ($Eu_2O_3$), gadolinium ($Gd_2O_3$), terbium ($Tb_4O_7$), dysprosium ($Dy_2O_3$), holmium ($Ho_2O_3$), erbium ($Er_2O_3$), thulium ($Tm_2O_3$), ytterbium ($Yb_2O_3$) and lutetium ($Lu_2O_3$). Additionally, phosphorescent materials known as "phosphors" may be included in the thermally stable backfill material. These may include calcium sulfide with strontium sulfide with bismuth as an activator (CaxSr)S: Bi, Zinc sulfide with copper "GS phosphor", mixtures of zinc sulfide and cadmium sulfide, strontium aluminate activated by Europium ($SrAl_2O_4$:Eu(II):Dy(III)), $BaMgAl_{10}O_{17}$:$Eu^{2+}$ (BAM), $Y_2O_3$:Eu, doped ortho-silicates, Yttrium aluminium garnet (YAG) and Lutetium aluminium garnet (LuAG) containing materials, any combinations thereof, and the like. A commercial example a phosphor may include one of the ISIPHOR™ inorganic phosphors (available from Merck KGaA, Darmstadt, Germany).

The nanoparticles are typically treated with a surface treatment agent. Surface-treating the nano-sized particles can provide a stable dispersion in the polymeric resin. Preferably, the surface-treatment stabilizes the nanoparticles so that the particles will be well dispersed in a substantially homogeneous composition. Furthermore, the nanoparticles can be modified over at least a portion of its surface with a surface treatment agent so that the stabilized particle can copolymerize or react with the parts of the composition during curing. In general, a surface treatment agent has a first end that will attach to the particle surface (covalently, ionically or through strong physisorption) and a second end that imparts compatibility of the particle with the composition and/or reacts with composition during curing. Examples of surface treatment agents include alcohols, amines, carboxylic acids, sulfonic acids, phosphonic acids, silanes and titanates. The preferred type of treatment agent is determined, in part, by the chemical nature of the metal oxide surface. Silanes are preferred for silica and other for siliceous fillers. Silanes and carboxylic acids are preferred for metal oxides such as zirconia. The surface modification can be done either subsequent to mixing with the monomers or after mixing. It is preferred in the case of silanes to react the silanes with the particle or nanoparticle surface before incorporation into the composition. The required amount of surface modifier is dependent upon several factors such particle size, particle type, modifier molecular weight, and modifier type. In general it is preferred that approximately a monolayer of modifier is attached to the surface of the particle. The attachment procedure or reaction conditions required also depend on the surface modifier used. For silanes, it is preferred to surface treat at elevated temperatures under acidic or basic conditions for from 1-24 hr approximately. Surface treatment agents such as carboxylic acids may not require elevated temperatures or extended time.

Representative embodiments of surface treatment agents suitable for the compositions include compounds such as, for example, isooctyl trimethoxy-silane, N-(3-triethoxysilylpropyl) methoxyethoxyethyl carbamate ($PEG_3TES$), N-(3-triethoxysilylpropyl) methoxyethoxyethoxyethyl carbamate ($PEG_2TES$), 3-(methacryloyloxy)propyltrimethoxysilane, 3-acryloxypropyltrimethoxysilane, 3-(methacryloyloxy)propyltriethoxysilane, 3-(methacryloyloxy) propylmethyldimethoxysilane, 3-(acryloyloxypropyl)methyldimethoxysilane, 3-(methacryloyloxy)propyldimethylethoxysilane, 3-(methacryloyloxy) propyldimethylethoxysilane, vinyldimethylethoxysilane, phenyltrimethoxysilane, n-octyltrimethoxysilane, dodecyltrimethoxysilane, octadecyltrimethoxysilane, propyltrimethoxysilane, hexyltrimethoxysilane, vinylmethyldiacetoxysilane, vinylmethyldiethoxysilane, vinyltriacetoxysilane, vinyltriethoxysilane, vinyltriisopropoxysilane, vinyltrimethoxysilane, vinyltriphenoxysilane, vinyltri-t-butoxysilane, vinyltris-isobutoxysilane, vinyltriisopropenoxysilane, vinyltris(2-methoxyethoxy) silane, styrylethyltrimethoxysilane, mercaptopropyltrimethoxysilane, 3-5 glycidoxypropyltrimethoxysilane, acrylic acid, methacrylic acid, oleic acid, stearic acid, dodecanoic acid, 2-[2-(2-methoxyethoxy) ethoxy]acetic acid (MEEAA), beta-carboxyethylacrylate, 2-(2-methoxyethoxy)acetic acid, methoxyphenyl acetic acid, and mixtures thereof. Further, a proprietary silane surface modifier, commercially available from OSI Specialties, Crompton South Charleston, W. Va. under the trade designation "Silquest A1230", has been found particularly suitable.

In some embodiments the thermally stable molecular species includes a metal, metal oxide or metal oxide precursor. Metal oxide precursors may be used in order to act as an amorphous "binder" for inorganic nanoparticles, or they may be used alone. Sol-gel techniques may be used to react these precursors in order to cure the material into a solid mass and are known to those skilled in the art. Suitable metal oxide precursors include alkyl titanates such as titanium (IV) butoxide, n-propyl titanate, titanium triethanolamine, titanium phosphate glycol, 2-ethylhexyl titanate, titanium (IV) ethoxide, titanium (IV) isopropoxide, and the like. These are commercially available under the "TYZOR" trade name owned by Dorf-Ketal Inc. (Houston, Tex.). Also suitable metal oxide precursors include zirconium chloride or zirconium(IV) alkoxides such as zirconium (IV) acrylate, zirconium(IV) tetraisopropoxide, zirconium(IV) tetraethoxide, zirconium (IV) tetrabutoxide, and the like, all available from Aldrich (St. Louis, Mo.). Also suitable metal oxide precursors include hafnium(IV) chloride or hafnium alkoxides such as hafnium (IV) carboxyethyl acrylate, hafnium(IV) tetraisopropoxide, hafnium(IV) tert-butoxide, hafnium(IV) n-butoxide, also available from Aldrich (St. Louis, Mo.). These materials can also be used as inorganic nanomaterials in the sacrificial template layer in order to form the bridging layer.

Sacrificial Materials

The sacrificial layer is a material capable of being baked out or otherwise removed while leaving the structured surface layer and the bridging layer, substantially intact. The sacrificial layer includes, for example, the sacrificial template layer and the optional sacrificial releasable layer, depending upon a construction of the transfer film. The structured surface of the sacrificial layer can be formed through embossing, a replication process, extrusion, casting, or surface structuring, for example. The structured surface can include nanostructures, microstructures, or hierarchical structures. Nanostructures comprise features having at least one dimension (e.g., height, width, or length) less than or equal to two microns. Microstructures comprise features having at least one dimension (e.g., height, width, or length) less than or equal to one millimeter. Hierarchical structures are combinations of nanostructures and microstructures.

The sacrificial layer (e.g., 12) can comprise any material as long as the desired properties are obtained. Preferably, the sacrificial layer is made from a polymerizable composition comprising polymers having number average molecular weights of about 1,000 Da or less (e.g., monomers and oligomers). Particularly suitable monomers or oligomers have molecular weights of about 500 Da or less, and even more particularly suitable polymerizable molecules have molecular weights of about 200 Da or less. Said polymerizable compositions are typically cured using actinic radiation, e.g., visible light, ultraviolet radiation, electron beam radiation, heat and combinations thereof, or any of a variety of conventional anionic, cationic, free radical or other polymerization techniques, which can be photochemically or thermally initiated.

Useful polymerizable compositions comprise curable functional groups known in the art, such as epoxide groups, allyloxy groups, (meth)acrylate groups, epoxide, vinyl, hydroxyl, acetoxy, carboxylic acid, amino, phenolic, aldehyde, cinnamate, alkene, alkyne, ethylenically unsaturated groups, vinyl ether groups, and any derivatives and any chemically compatible combinations thereof.

The polymerizable composition used to prepare the sacrificial template layer may be monofunctional or multifunctional (e.g, di-, tri-, and tetra-) in terms of radiation curable moieties. Examples of suitable monofunctional polymerizable precursors include styrene, alpha-methylstyrene, substituted styrene, vinyl esters, vinyl ethers, octyl (meth)acrylate, nonylphenol ethoxylate (meth)acrylate, isobornyl (meth) acrylate, isononyl (meth)acrylate, 2-(2-ethoxyethoxy)ethyl (meth)acrylate, 2-ethylhexyl (meth)acrylate, lauryl (meth) acrylate, beta-carboxyethyl (meth)acrylate, isobutyl (meth) acrylate, cycloaliphatic epoxide, alpha-epoxide, 2-hydroxyethyl (meth)acrylate, isodecyl (meth)acrylate, dodecyl (meth)acrylate, n-butyl (meth)acrylate, methyl (meth)acrylate, hexyl (meth)acrylate, (meth)acrylic acid, N-vinylcaprolactam, stearyl (meth)acrylate, hydroxyl functional caprolactone ester (meth)acrylate, isooctyl (meth)acrylate, hydroxyethyl (meth)acrylate, hydroxypropyl (meth)acrylate, hydroxyisopropyl (meth)acrylate, hydroxybutyl (meth)acrylate, hydroxyisobutyl (meth)acrylate, tetrahydrofuryl (meth) acrylate, and any combinations thereof.

Examples of suitable multifunctional polymerizable precursors include ethyl glycol di(meth)acrylate, hexanediol di(meth)acrylate, triethylene glycol di(meth)acrylate, tetraethylene glycol di(meth)acrylate, trimethylolpropane tri (meth)acrylate, trimethylolpropanepropane tri(meth)acrylate, glycerol tri(meth)acrylate, pentaerythritol tri(meth) acrylate, pentaerythritol tetra(meth)acrylate, neopentyl glycol di(meth)acrylate, bisphenol A di(meth)acrylate, poly (1,4-butanediol) di(meth)acrylate, any substituted, ethoxylated or propoxylated versions of the materials listed above, or any combinations thereof.

The polymerization reactions generally lead to the formation of a three-dimensional "crosslinked" macromolecular network and are also known in the art as negative-tone photoresists, as reviewed by Shaw et al., "Negative photoresists for optical lithography," IBM Journal of Research and Development (1997) 41, 81-94. The formation of the network may occur through either covalent, ionic, or hydrogen bonding, or through physical crosslinking mechanisms such as chain entanglement. The reactions can also be initiated through one or more intermediate species, such as free-radical generating photoinitiators, photosensitizers, photoacid generators, photobase generators, or thermal acid generators. The type of curing agent used depends on the polymerizable precursor used and on the wavelength of the radiation used to cure the polymerizable precursor. Examples of suitable commercially available free-radical generating photoinitiators include benzophenone, benzoin ether, and acylphosphine photoinitiators, such as those sold under the trade designations "IRGACURE" and "DAROCUR" from Ciba Specialty Chemicals, Tarrytown, N.Y. Other exemplary photoinitiators include 2,2-dimethoxy-2-phenylacetophenone (DMPAP), 2,2-dimethoxyacetophenone (DMAP), xanthone, and thioxanthone.

Co-initiators and amine synergists may also be included to improve curing rates. Suitable concentrations of the curing agent in the crosslinking matrix range from about 1 wt. % to about 10 wt. %, with particularly suitable concentrations ranging from about 1 wt. % to about 5 wt. %, based on the entire weight of the polymerizable precursor. The polymerizable precursor may also include optional additives, such as heat stabilizers, ultraviolet light stabilizers, free-radical scavengers, and combinations thereof. Examples of suitable commercially available ultraviolet light stabilizers include benzophenone-type ultraviolet absorbers, which are available under the trade designation "UVINOL 400" from BASF Corp., Parsippany, N.J.; under the trade designation "CYASORB UV-1164" from Cytec Industries, West Patterson, N.J.; and under the trade designations "TINUVIN 900," "TINUVIN 123" and "TINUVIN 1130" from Ciba Specialty chemicals, Tarrytown, N.Y. Examples of suitable concentrations of ultraviolet light stabilizers in the polymerizable precursor range from about 0.1 wt. % to about 10 wt. %, with particularly suitable total concentrations ranging from about 1 wt. % to about 5 wt. %, relative to the entire weight of the polymerizable precursor.

Examples of suitable free-radical scavengers include hindered amine light stabilizer (HALS) compounds, hydroxylamines, sterically hindered phenols, and combinations thereof. Examples of suitable commercially available HALS compounds include the trade designated "TINUVIN 292" from Ciba Specialty Chemicals, Tarrytown, N.Y., and the trade designated "CYASORB UV-24" from Cytec Industries, West Patterson, N.J. Examples of suitable concentrations of free radical scavengers in the polymerizable precursor range from about 0.05 wt. % to about 0.25 wt. %.

Patterned structured template layers can be formed by depositing a layer of a radiation curable composition onto one surface of a radiation transmissive carrier to provide a layer having an exposed surface, contacting a master with a preformed surface bearing a pattern capable of imparting a three-dimensional structure of precisely shaped and located interactive functional discontinuities including distal surface portions and adjacent depressed surface portions into the exposed surface of the layer of radiation curable composition on said carrier under sufficient contact pressure to impart said pattern into said layer, exposing said curable composition to a sufficient level of radiation through the carrier to cure said composition while the layer of radiation curable composition is in contact with the patterned surface of the master. This cast and cure process can be done in a continuous manner using a roll of carrier, depositing a layer of curable material onto the carrier, laminating the curable material against a master and curing the curable material using actinic radiation. The resulting roll of carrier with a patterned, structured template disposed thereon can then be rolled up. This method is disclosed, for example, in U.S. Pat. No. 6,858,253 (Williams et al.).

Other materials that may be used for the sacrificial layer include, polyvinyl alcohol (PVA), ethylcellulose, methylcellulose, polynorbornenes, poly(methylmethacrylate (PMMA), poly(vinylbutyral), poly(cyclohexene carbonate), poly(cyclohexene propylene) carbonate, poly(ethylene carbonate), polypropylene carbonate) and other aliphatic polycarbonates, and any copolymer or blends thereof, and other materials described in chapter 2, section 2.4 "Binders" of R. E. Mistler, E. R. Twiname, Tape Casting: Theory and Practice, American Ceramic Society, 2000. There are many commercial sources for these materials. These materials are typically easy to remove via dissolution or thermal decomposition via pyrolysis or combustion. Thermal heating is typically part of many manufacturing processes and thus removal of the sacrificial material may be accomplished during an existing heating step. For this reason, thermal decomposition via pyrolysis or combustion is a more preferred method of removal.

There are several properties that are preferred in the sacrificial materials. The material should be capable of being coated onto a substrate via extrusion, knife coating, solvent coating, cast and cure, or other typical coating methods. It is preferred that the material be a solid at room temperature. For thermoplastic sacrificial materials, it is preferred that the glass transition temperature (Tg) is low enough to allow it to be embossed by a heated tool. Thus, it is preferred that the sacrificial material have a Tg above 25° C., more preferred above 40° C. and most preferred above 90° C.

Another material property that is desired for the sacrificial material is that its decomposition temperature be above the curing temperature of the backfill material(s). Once the backfill material is cured, the structured layer is permanently formed and the sacrificial template layer can be removed via any one of the methods listed above. Materials that thermally decompose with low ash or low total residue are preferred over those that have higher residuals. Residue left behind on a substrate may adversely impact electrical and/or optical properties such as the conductivity, transparency or color of the final product. Since it is desirable to minimize any changes to these properties in the final product, residual levels of less than 1000 ppm are preferred. Residuals levels of less than 500 ppm are more preferred and residual level below 50 ppm are most preferred.

The term "cleanly baked out" means that the sacrificial layer can be removed by pyrolysis or combustion without leaving a substantial amount of residual material such as ash. Examples of preferred residual levels are provided above, although different residual levels can be used depending upon a particular application.

In certain embodiments, swelling occurs in the polymer in the presence of certain solvents. The solvent laden polymer can allow for uptake of the thermally stable molecular species, but may also inhibit uptake of the thermally stable molecular species depending on the materials involved. The solvent may also change the distribution of the thermally stable molecular species in the polymer, which will affect the final size, shape or morphology of the bridge.

Sacrificial Adhesive Layer

The sacrificial adhesive layer can be implemented with any material enhancing adhesion of the transfer film to the receptor substrate without substantially adversely affecting the performance of the transfer film. This layer can also be described as an adhesion promoting layer. The sacrificial adhesive layer appears to facilitate the final permanent bond between the receptor substrate and the baked-out thermally stable structure. The sacrificial adhesive layer is capable of being cleanly baked out during the methods described herein.

Objects and advantages of this disclosure are further illustrated by the following examples, but the particular materials and amounts thereof recited in these examples, as well as other conditions and details, should not be construed to unduly limit this disclosure.

EXAMPLES

All parts, percentages, ratios, etc. in the examples are by weight, unless noted otherwise. Solvents and other reagents used were obtained from Sigma-Aldrich Corp., St. Louis, Mo. unless specified differently.

Synthesis of Polybutanediol 2900 Diacrylate

Acrylate groups are attached to a polybutanediol oligomer with hydroxyl end functionality. The synthetic scheme is shown below.

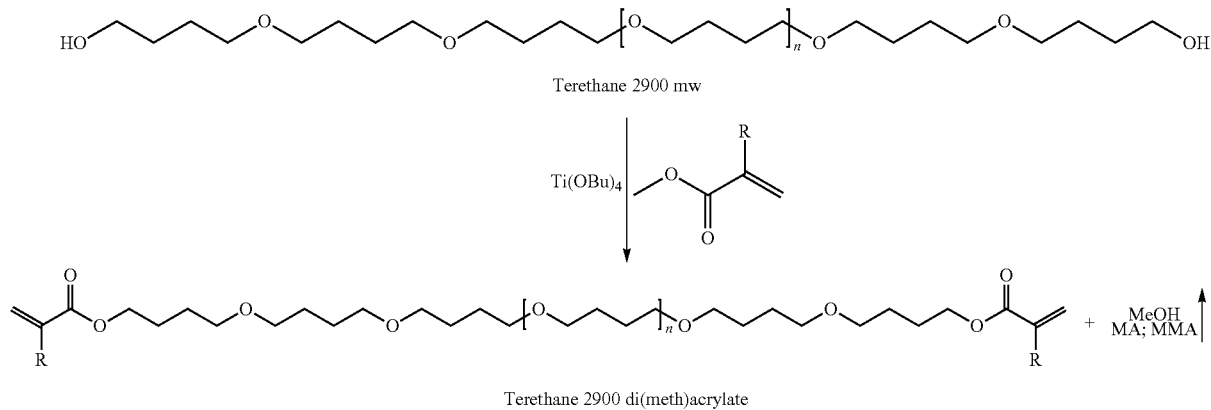

A 1000 ml three neck round bottom flask is equipped with a nitrogen sparge line, temperature probe, addition funnel, mechanical stirrer, heating mantle, and Vigeraux column with a distillation take-off head and round bottom flask receiver. A mixture of 420 grams poly tetrahydrofuran diol (average molecular weight=2900 g/mol), 211 grams methyl acrylate, 0.5 grams titanium (IV) butoxide, 0.12 grams Aluminum N-nitrosophenylhydroxylamine, and 0.1 grams 4-hydroxy TEMPO was added to the flask. A mild and steady sparge of nitrogen gas was put into the bulk of the reaction.

The reaction is heated to a temperature of ~100° C., with good agitation of the reaction mixture. The reaction is allowed to continue until about 200 milliliters of methanol and methyl acrylate are distilled into the receiver. At this point, an additional 420 grams of methyl acrylate is added dropwise through the addition funnel, keeping the addition rate roughly equivalent to the rate of distillation through the column into the receiver. This addition takes approximately 6 hours to complete. The reaction pot temperature is adjusted as necessary to keep a steady distillation rate, but does not exceed 120° C. After completing the addition, the reaction is held at 110° C. for about 12 hours. Next, the distillation receiver is emptied, and a vacuum is pulled on the reaction using an aspirator. With a full aspirator vacuum, the reaction temperature is held at 110° C. for one hour after no additional distillate is removed. Finally, the flask is cooled to about ~60° C. and poured into a jar. Analysis by NMR and LC show the product is >99% of the desired material.

Example 1

Bridged Nanostructured Article

Resin Formation

In order to create a "bridged" nanostructured surface, 60 wt. % the PBD-2900 resin described above is mixed with 40% SR601 ethoxylated bisphenol diacrylate (Sartomer Co, Exton, Pa.) as an additional crosslinking monomer. The chemical structure of both resins is shown in below.

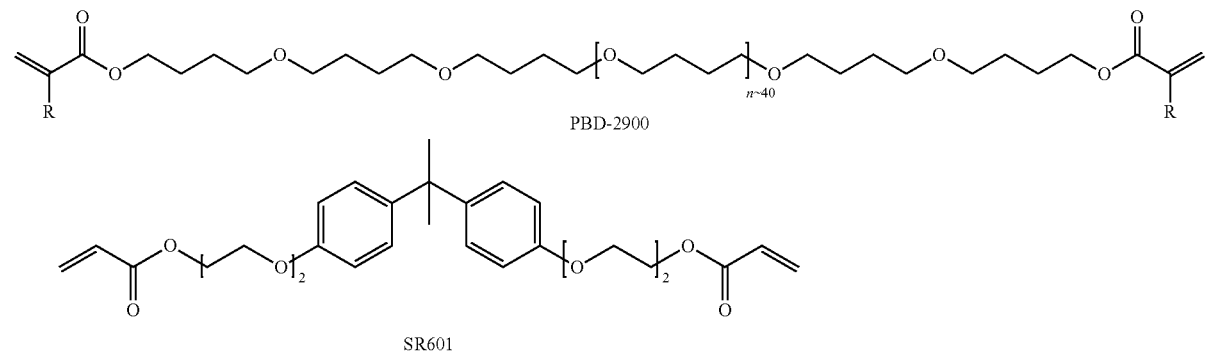

The PBD-2900/SR601 resin is mixed with 0.5% Darocur 1173 and 0.1% Lucirin TPO photoinitiators and rolled for 24 hours until all solids are fully dissolved.

Microstructured Film

Microstructured films are prepared by molding and UV curing the resin on 2 mil unprimed PET film coated with 8 micrometers of PMMA copolymer (75 wt. % polymethylmethacrylate, 25 wt. % polyethyl acrylate, "PRD510-A", Altuglas Inc.) using a roll-to-roll web coating process. The resin is poured onto the moving web, at a web speed of about 10 ft/min (about 3 meters/min.), and the coated web is pressed against a microstructured release-coated polymer tool using a nip heated to 90° F. (43° C.) and a pressure of 30 psi. While in contact with the polymer tool, the resin is then cured using two banks of FUSION high intensity UV D-bulb lamps (obtained from Fusion Systems, Rockville, Md.), one set at 600 watt/2.5 cm (100% power setting), and the other set at 360 watt/2.5 cm (60% power setting). The cured, microstructured resin is separated from the polymer tool and wound into a roll. The resulting microstructured film has prisms of 540 nm height with a periodicity of 600 nm.

A sample of the cured PBD-2900/SR601 resin film (2 in×3 in-50 mm×75 mm) is coated with PERMANEW 6000 (California Hardcoating Company, Chula Vista, Calif.) by spin coating. A solution is created by diluting PERMANEW 6000 to 15 wt % by adding a 80/20 (w/w) of isopropanol/butanol solvent system filtered through a 1.0 µm PTFE filter. A glass microscope slide is used to support the film during the spin coating process. The sample was mounted on the vacuum chuck of a Model WS-650S-6/npp lite spin coater (Laurell Technologies Corporation, North Wales, Pa. USA). A vacuum of 64 kPa (19 inches of Hg) is applied to hold the glass to the chuck. The spin coater is programmed for 500 RPM for 10 seconds (coating application step) then 2000 RPM for 10 sec (spin step), then 500 RPM for 10 seconds (dry step). The sample is removed from the spin coater and placed on a hotplate at 80° C. for 4 hours to remove the solvent and cure the PERMANEW 6000 to a partially cured state.

Sacrificial Adhesive Layer Coating

Glass slides, 50 mm×75 mm, are cleaned with IPA and a lint free cloth. The slide is mounted on the vacuum chuck of a Model WS-650S-6/npp lite spin coater (Laurell Technologies Corporation, North Wales, Pa. USA). A vacuum of 64 kPa (19 inches of Hg) is applied to hold the glass to the chuck. The spin coater is programmed for 500 RPM for 10 seconds (coating application step) then 1500 RPM for 10 sec (spin step), then 500 RPM for 10 seconds (dry step).

A solution of IOA/AA Optically Clear Adhesive (90% isooctylacrylate, 10% acrylic acid, as described in U.S. Reexam patent RE24,906 (Ulrich)) is diluted to 5.4 wt % in ethyl acetate/heptane. Approximately 2-3 mL of the IOA/AA solution is applied to the glass slide during the coating application portion of the spin cycle. The slide is then removed from the spin coater and put on a hotplate at 100° C. for 30 minutes and covered with an aluminum tray. The slide is then allowed to cool to room temperature.

Lamination

The partially cured film stack is laminated at 160° F. (71° C.) to the IOA/AA coated glass slide using a thermal film laminator (GBC Catena 35, GBC Document Finishing, Lincolnshire, Ill.). The laminated sample is removed from the laminator and allowed cool to room temperature.

Bake-Out

After lamination, the unprimed PET supporting the film stack is separated from the PMMA copolymer leaving the PMMA copolymer and all other layers adhered to the glass slide. The sample is placed in a box furnace (Lindberg Blue M box furnace model BF51732PC-1, Asheville N.C., USA) and brought from 25° C. to 300° C. at a rate of approximately 10° C./min. The furnace is held at 300° C. for thirty minutes, then heated to 500° C. at a rate of approximately 10° C./min and held for one hour. The furnace and sample are then allowed to cool down to ambient temperature.

For surface imaging, specimens are mounted on an aluminum stub. Cross sections are prepared by scoring with a scribe and fracturing at ambient. These are mounted on an additional stub. All specimens are sputter coated with gold/palladium and were examined using a Hitachi S-4500 Field Emission Scanning Electron Microscope. All images are the product of secondary electron imaging (SEI), a technique used to image surface morphology of a sample. The resulting bridged inorganic nanostructure is shown in FIGS. 8A and 8B.

The surfaces of these "bridged" samples are examined using X-ray Photoelectron Spectroscopy (XPS). This technique typically provides an analysis of the outermost 3 to 10 nanometers (nm) on the specimen surface, but in this case an Argon ion gun is used to ablate the top layers of the bridged sample. The photoelectron spectra with ablation can provide information about the distribution of elemental and chemical (oxidation state and/or functional group) concentrations present through the sample. It is sensitive to all elements in the periodic table except hydrogen and helium with detection limits for most species in the 0.1 to 1 atomic % concentration range. The conditions during the XPS analysis are reported in Table 1 below.

TABLE 1

XPS analysis conditions for bridge composition experiment

| | |
|---|---|
| Instrument | Physical Electronics VersaProbe 5000 ™ |
| analysis areas | ~500 μm × 1500 μm |
| photoelectron take off angle | 45° ± 20° solid angle of acceptance |
| x-ray source | Monochromatic Al Kα (1486.6 eV) 85 W |
| charge neutralization | Low energy $e^-$ and $Ar^+$ flood sources |
| charge correction | None |
| sputter ion gun conditions | 2 keV $Ar^+$, 2 mm by 2 mm raster, ~10 nm/min $SiO_2$ |
| analysis chamber pressure | ~5 × $10^{-8}$ Torr |

Figure 9:
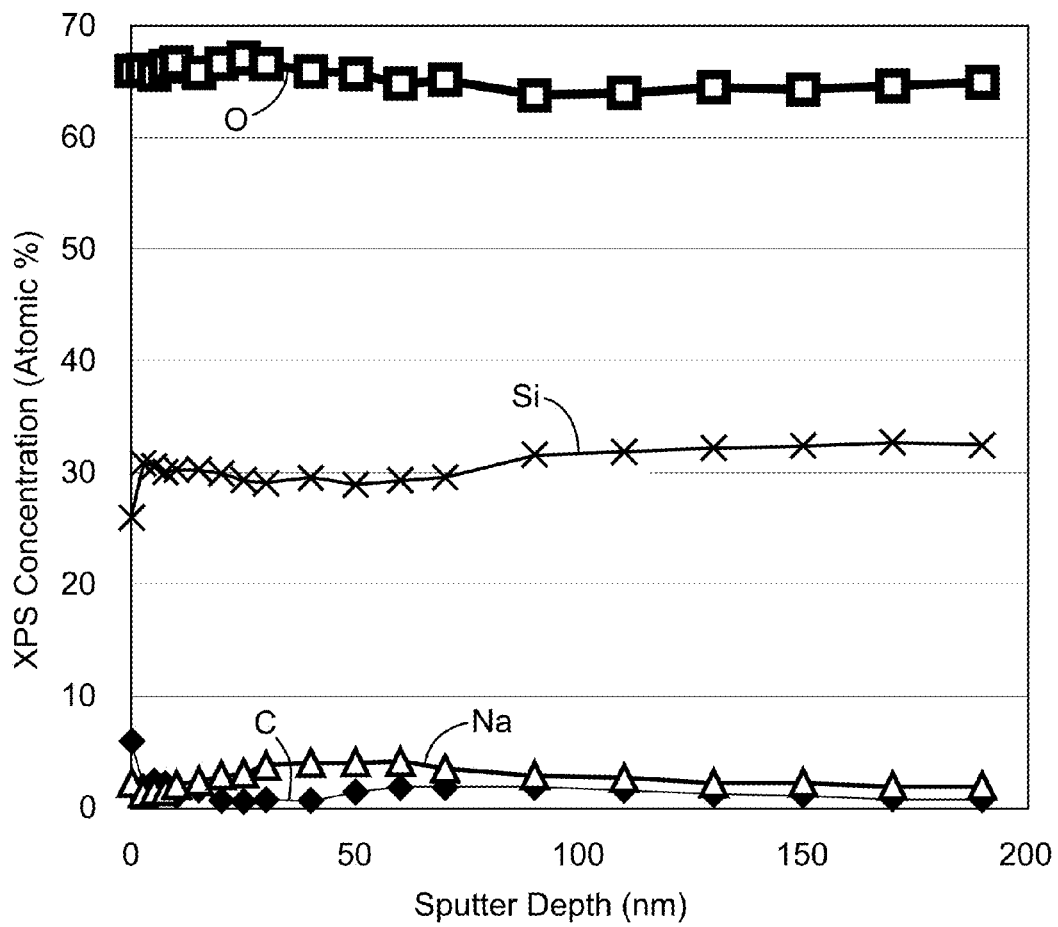
FIG. 9 is a graph of XPS atomic concentration as a function of depth on the baked out final bridged nanostructure confirming the presence of silicon.
Figure 10A:
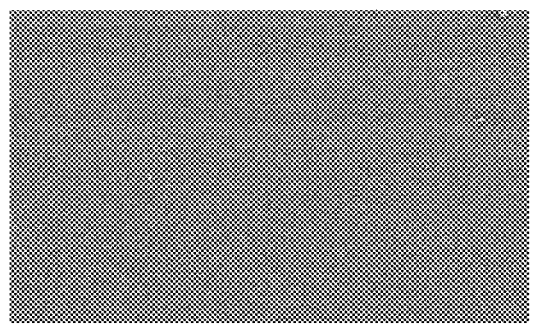
FIG. 10A-10D illustrate SEM micrographs of another illustrative baked out final bridged nanostructure where the top two photos (10B and 10B) are plan or top views and the bottom two photos (10C and 10D) are cross-sectional views at a 50 k and a 15 k magnifications.
Figure 10B:
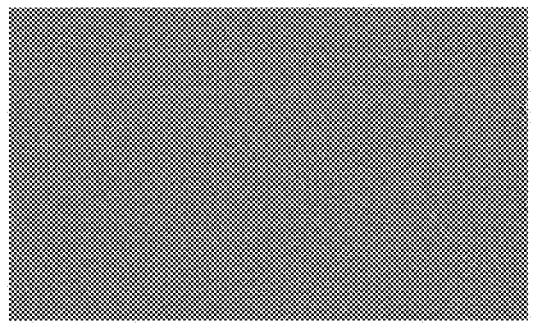
Figure 10C:
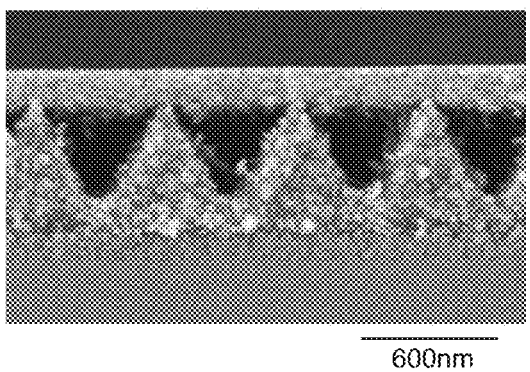
Figure 10D:
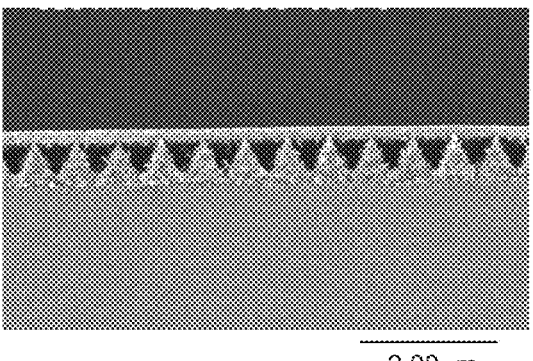
Figure 11A:
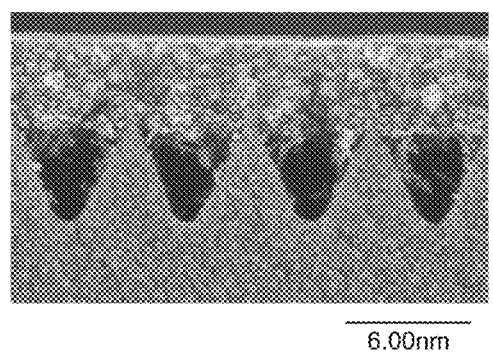
FIG. 11A-11D illustrate SEM micrographs of another illustrative baked out final bridged nanostructure where the bottom two photos (11C and 11D) are plan or top views and the top two photos (11A and 11B) are cross-sectional views at a 50 k and a 15 k magnifications.
Figure 11B:
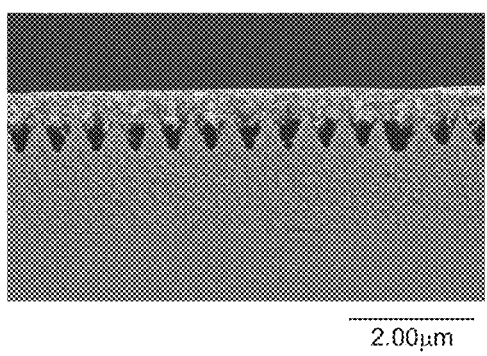
Figure 11C:
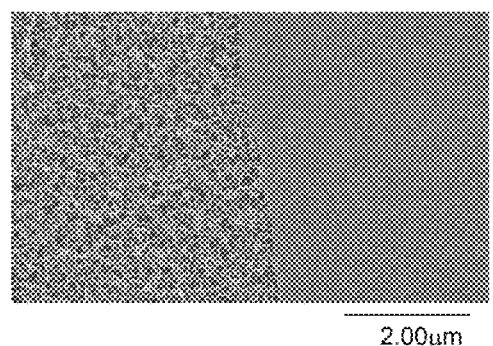
Figure 11D:
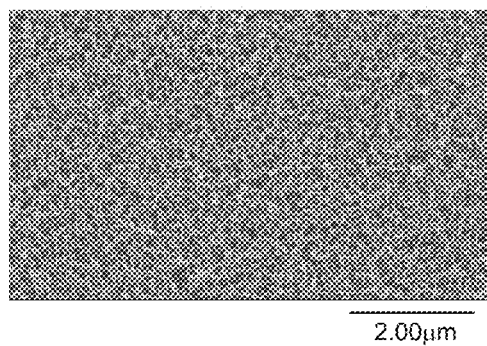

The results of this experiment are shown below in FIG. 9, confirming the presence of silicon throughout the top 200 nm of the bridge layer. FIG. 9 is XPS atomic concentration as a function of sputter depth on bridged nanostructure confirming presence of silicon Example 2

Creation of Bridged Nanostructured Surface with a Silecs Backfill

All steps and materials described in Example 1 above are used here, except a high refractive index (n=1.85) polysiloxane coating solution "SC850" (Silecs Oy, Finland) is used in place of the Perma-New 6000 hardcoat solution. The SC850 is baked at 100° C. for four hours in order to remove the methylisobutylketone solvent in this formulation. A collection of SEM micrographs from the resulting microstructure is shown in FIG. 10A-D. FIG. 10 illustrates (a,b) SEM with various magnifications of sample in plan-view (c,d) SEM cross-sections of PBD-2900/601 sample backfilled with Silec 850 after bake-out.

Example 3

Changing Bridge Morphology

Synthesis of MTES-Silica in Ethanol Procedure

A 1000 ml 3-neck round bottom flask is charged with 266.5 grams of Nalco 1034A (35.0% aqueous silica sol) (Nalco Company, Naperville, Ill.). With the batch mixing, 372.5 grams methyltriethoxysilane, MTES, (Alfa Aesar, Ward Hill, Mass.) and 25.5 grams glacial acetic acid (EMD Chemicals Inc., Gibbstown, N.J.) are added to the batch. The batch is heated to 60° C. and held for 1 hour. After 1 hour, the batch is allowed to cool to room temperature. After approximately 4 hours at room temperature, 1.03 grams formic acid, ACS, 88+% (Alfa Aesar, Ward Hill, Mass.) and 7.21 grams tetramethylammonium hydroxide, 25% w/w in methanol (Alfa Aesar, Ward Hill, Mass.) are added to the batch. The batch is heated to approximately 80° C. and held overnight (approximately 16 hours), then allowed to cool to room temperature.

A diluted sample of MTES-silica in ethanol is made by adding a 50 gram aliquot of the reaction mixture described above and 8.8 grams anhydrous alcohol (95/5 v/v ethanol/2-propanol) (JT Baker, Phillipsburg, Pa.) to a 125 glass bottle. The final diluted sample is a low viscosity, translucent dispersion and is measured to be 30.9 wt % solids.

Formulation

All process steps described in Example 1 above are used, except the custom synthesized MTES-based polysiloxane coating solution in ethanol is used in place of the Perma-New 6000 hardcoat solution. A collection of cross-section and plan-view SEM micrographs from the resulting microstructure is shown in FIG. 11A-D. FIG. 11 illustrates 11A and 11B SEM cross-sections of PBD-2900/SR601 transfer films backfilled with MTES-Silica solution in ethanol, while 11C shows a plan-view SEM micrograph. The right side of this image shows an additional "skin" layer that forms on top of the porous inorganic microstructure and 11D shows a close-up of the same porous microstructure.

Example 4

Creation of Non-Planar Bridge Structure

All process steps described in Example 1 above are used, except SR415 (highly ethoxylated trimethylolpropane triacrylate) is used instead of the PBD-2900/SR601 sacrificial resin system. The same photoinitiator system (0.5 wt. % Darocur 1173, 0.1% Lucirin TPO) is used in this resin. A cross-sectional SEM micrograph from the resulting microstructure is shown in FIG. 12. FIG. 12 illustrates an SEM cross-section micrograph of a microstructures SR415 sample backfilled with Perma-New 6000 after bake-out Example 5

Bi-Layer Bridge Using Zirconia Nanoparticle Dopants

Synthesis of A-174 Functionalized Zirconia Nanoparticles

A 3000 ml 3-neck round bottom flask is charged with 600.0 grams of a 45.4 wt. % solids dispersion of 10 nm zirconia particles (prepared as described in U.S. Pat. No. 7,241,437 and U.S. Pat. No. 6,376,590). Next, the flask is equipped with a stir bar, stir plate, condenser, heating mantle, thermocouple and temperature controller. With the batch mixing, 380.6 grams deionized water and 1000.0 grams 1-methoxy-2-propanol (Alfa Aesar, Ward Hill, Mass.) are added to the batch. The batch is held for approximately 15 minutes at room temperature with mixing. During this 15 minute hold, 73.0 grams of 97% 3-(Methacryloxypropyl)trimethoxysilane (Alfa Aesar, Ward Hill, Mass.), 0.61 grams of a 5 wt. % Prostab 5198 (BASF, Florham Park, N.J.) aqueous solution and 400 g 1-methoxy-2-propanol are added to a 1000 ml poly beaker. The 3-(methacryloxypropyl)trimethoxysilane/Prostab/1-methoxy-2-propanol premix is added to the batch with stirring. The premix beaker is rinsed with aliquots of 1-methoxy-2-propanol totaling 70.0 grams. The rinses are added to the batch. Next 5.0 grams 29% ammonium hydroxide (EMD Chemical Inc, Gibbstown, N.J.) is added to the batch. The batch is heated to 80° C. and held for approximately 16 hours with mixing. After the 16 hour hold, the batch is allowed to cool to room temperature. The water is removed from the batch by alternate vacuum distillation and addition of 1500 grams 1-methoxy-2-propanol. The batch is concentrated by vacuum distillation to result in a very fluid translucent dispersion with 62.3 wt % solids of A-174 functionalized zirconia.

All process steps described in Example 1 above are used, except a sacrificial resin that is also known to show the bridging effect was doped with the zirconia nanoparticles described above. A 10 wt. % solution of $ZrO_2$-A174 described above is charged into SR9038 (highly ethoxylated BPA diacrylate, Sartomer Co.,) relative to the weight of the SR9038 along with 0.5 wt. % Darocur 1173 and 0.1 wt. % TPO photoinitiators. The chemical structure of SR9038 and SEM cross-sectional micrographs of the resulting samples after bake-out is shown in FIG. 13A-B.

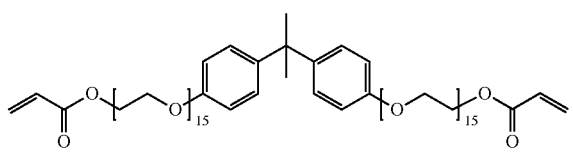

Chemical structure of SR9038 resin

Figure 14:
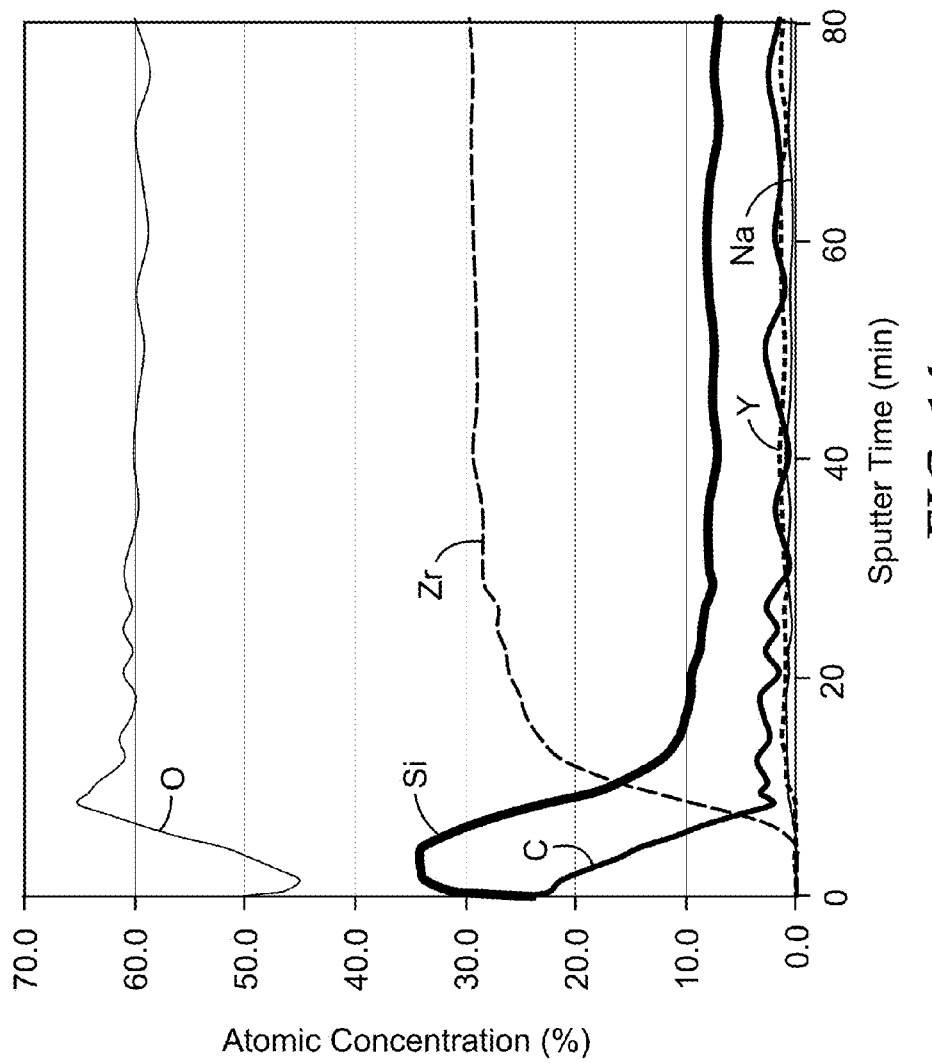
FIG. 14 is a graph of XPS atomic concentration as a function of film depth on an illustrative transfer film.

XPS sputter depth profiles are obtained from this sample. The spectra are shown in FIG. 14 below, and the analysis conditions for the experiment are outlined in Table 2. Three spots are profiled and all are found to have a surface layer rich in O, Si and C and free of Zr. Estimation of the layer thickness from XPS was ~25-35 nm. Beneath this layer, a thicker layer rich in O and Zr along with lower levels of Si, C, Y and Na was found. Profiles were stopped within this second layer. FIG. 14 illustrates an example sputter depth profile. Three areas are examined and all gave similar results. The surface layer (up to ~10 minutes of sputtering) is rich in O, Si and C. When this layer is penetrated, a layer rich in O and Zr with lower levels of Si, C, Y.

TABLE 2

| XPS analysis conditions | |
|---|---|
| Instrument | Physical Electronics Quantera II ™ |
| analysis areas | ~500 μm × 1500 μm |
| photoelectron take off angle | 45° ± 20° solid angle of acceptance |
| x-ray source | Monochromatic Al Kα (1486.6 eV) 85 W |
| charge neutralization | Low energy e⁻ and Ar⁺ flood sources |
| charge correction | None |
| sputter ion gun conditions | 2 keV Ar⁺, 3 mm by 3 mm raster, ~3.4 nm/min $SiO_2$ |
| analysis chamber pressure | <3 × 10⁻⁸ Torr |

Example 6

To illustrate the ability to independently modify the refractive index of both the bridge and the nanostructured layer, four examples were created according to Table 3 below.

TABLE 3

| | Structured Layer Refractive Index | Bridge Layer Refractive Index |
|---|---|---|
| Example 6a | Si rich | Si rich |
| Example 6b | Si rich | Zr rich |
| Example 6c | Zr rich | Si rich |
| Example 6d | Zr rich | Zr rich |

Example 6a

Silica Loaded Structured Layer, Silica Loaded Bridge Layer

Bridge Layer Coating

The substrate film was an unprimed 2 mil unprimed PET film coated with 4 micron thick PMMA copolymer (75 wt. % polymethylmethacrylate, 25 wt. % polyethyl acrylate, "PRD510-A", Altuglas Inc.) using a roll-to-roll web coating process. A bridge resin solution was created by mixing oil ethoxylated bisphenol A dimethacrylate (SR540, available from Sartomer Company, Exton, Pa.) including a photoinitator package comprising 0.5% Darocur 1173 and 0.1 wt. % TPO, with PermaNew 6000 (available from California Hardcoating Company, Chula Vista, Calif.) in a 95:5 resin:PermaNew ratio. The resin mixture was coated between the base film and a release liner (Release Liner, 50 microns thick, commercially available from CP Films, Fieldale, Va. as "T50") in a nip with a fixed gap of 0 mil, with a pressure of 80 PSI. The laminate was cured with radiation from a Fusion "D" lamp operating at 600 W/in was transmitted through the film to cure the resin while in contact with the release liner. The release liner was then removed from the sample, resulting in a thin layer of cured bridge resin on a PMMA copolymer coated PET film.

Structured Template

The substrate used was a primed 0.002 inch (0.051 mm) thick PET. The replicating resin was a 75/25 blend of SR 399 and SR238 (both available from Sartomer USA, Exton, Pa.) with a photoinitator package comprising 1% Darocur 1173 (Available from Ciba, Tarrytown, N.Y.), 1.9 wt. % triethanolamine (available from Sigma-Aldrich, St. Louis, Mo.), and 0.5 wt. % OMAN071 (available from Gelest, Inc. Morrisville, Pa.). Replication of the resin was conducted at 20 ft/min (6.1 m/min) with the replication tool temperature at 137 deg F. (58 deg C.). Radiation from a Fusion "D" lamp operating at 600 W/in was transmitted through the film to cure the resin while in contact with the tool. The replication tool was patterned with a 600 nm pitch linear sawtooth groove.

The replicated template film was primed in a plasma chamber using argon gas at a flow rate of 250 standard cc/min (SCCM), a pressure of 25 mTorr and RF power of 1000 Watts for 30 seconds. Subsequently, a release coated tool surface was prepared by subjecting the samples to a tetramethylsilane (TMS) plasma at a TMS flow rate of 150 SCCM but no added oxygen, which corresponded to an atomic ratio of oxygen to silicon of about 0. The pressure in the plasma chamber was 25 mTorr, and the RF power of 1000 Watts was used for 10 seconds. This created a release coated structured tool film.

Structured Layer Coating

The structured resin layer was then coated on the cured bridge resin on the PMMA copolymer coated PET film. The structured resin was ethoxylated bisphenol A dimethacrylate (SR540, available from Sartomer Company, Exton, Pa.) including a photoinitator package comprising 0.5 wt. % Darocur 1173 and 0.1 wt. % TPO. The resin was coated between the base film and the structured tool film in a nip with a fixed gap of 0 mil, with a pressure of 10 PSI. The laminate was cured with radiation from a Fusion "D" lamp operating at 600 W/in was transmitted through the film to cure the resin while in contact with the structured tool film. The structured tool film was then removed from the sample, resulting in a film stack consisting of a thin layer of cured structured resin, a thin layer of bridging resin, a PMMA copolymer layer, and PET.

Backfill Coating

A section of the film stack previously described was attached to a 50 mm×75 mm in microscope slide with tape. A backfill coating solution was created with PermaNew 6000 (available from California Hardcoating Company, Chula Vista, Calif.) was diluted to 15% w/w in IPA/butanol, brought to room temperature, and filtered through a 1.0 um filter. The sample of the treated film was coated with the PermaNew solution, which was applied to the film sample by spin coating on a Cee 200X Precision spin coater (Brewer Science, Inc. Rolla, Mo.). The spin parameters were 500 rpm/3 sec (solution application), and 2000 rpm/30 sec, then 500 rpm for 10 seconds. Approximately 5 milliliters of the PermaNew solution was applied to the replicated film during the solution application step of the spin cycle. The coated sample was placed in a oven at 80° C. for four hours to cure the PermaNew coating, then cooled to room temperature.

Sacrificial Adhesive Layer Coating

Glass slides, 50 mm×73 mm, were cleaned with IPA and a lint free cloth. The slide was mounted on the vacuum chuck of a spin coater. The spin coater was programmed for 500 RPM for 5 seconds (coating application step) then 1500 RPM for 10 sec (spin step), then 500 RPM for 60 seconds (dry step).

A solution of IOA/AA Optically Clear Adhesive (90% isooctylacrylate, 10% acrylic acid, as described in U.S. Reexam patent RE24,906 (Ulrich)) was diluted to 5 wt % in ethyl acetate/heptane. Approximately 1-2 mL of the IOA/AA solution was applied to the glass slide during the coating application portion of the spin cycle. The slide was then removed from the spin coater and allowed to dry.

Lamination

The film was laminated at 71 degrees centigrade (180° F.) to the IOA/AA coated glass slide using a thermal film laminator (GBC Catena 35, GBC Document Finishing, Lincolnshire, Ill.). The laminated sample was removed from the laminator and allowed cool to room temperature.

Bake-Out

After lamination, the PET support was separated from the laminated layers, leaving the Perma-New, SR540, co-PMMA, and IOA/AA layers adhered to the glass slide. The sample was placed in a box furnace (Lindberg Blue M box furnace model BF51732PC-1, Asheville N.C., USA) and brought from 25° C. to 300° C. at a rate of approximately 10° C./min. The furnace was held at 300° C. for thirty minutes, then heated to 500° C. at a rate of approximately 10° C./min and held for one hour to decompose the IOA/AA, PMMA copolymer and the SR540. The furnace and sample were then to cool down to ambient temperature. A cross-sectional SEM micrograph from the resulting microstructure is shown in FIG. 16.

Example 6b

Silica Loaded Structured Layer, Zirconia Loaded Bridge Layer

Preparation of Zr Filled Bridge Resin 3-(Methacryloxypropyl)trimethoxysilane-Zirconia particles were prepared as follows: A 3000 ml 3-neck round bottom flask was charged with 600.0 grams of a 45.4 wt % solids dispersion of 10 nm zirconia particles (prepared as described in U.S. Pat. No. 7,241,437 and U.S. Pat. No. 6,376,590). Next, the flask was equipped with a stir bar, stir plate, condenser, heating mantle, thermocouple and temperature controller. With the batch mixing, 380.6 grams deionized water and 1000.0 grams 1-methoxy-2-propanol (Alfa Aesar, Ward Hill, Mass.) were added to the batch. The batch was held for approximately 15 minutes at room temperature with mixing. During this 15 minute hold, 73.0 grams of 97% 3-(Methacryloxypropyl)trimethoxysilane (Alfa Aesar, Ward Hill, Mass.), 0.61 grams of a 5 wt % Prostab 5198 (BASF, Florham Park, N.J.) aqueous solution and 400 g 1-methoxy-2-propanol were added to a 1000 ml poly beaker. The 3-(methacryloxypropyl)trimethoxysilane/Prostab/1-methoxy-2-propanol premix was added to the batch with stirring. The premix beaker was rinsed with aliquots of 1-methoxy-2-propanol totaling 70.0 grams. The rinses were added to the batch. Next 5.0 grams 29% ammonium hydroxide (EMD Chemical Inc, Gibbstown, N.J.) was added to the batch. The batch heated to 80° C. and held for approximately 16 hours with mixing. After the 16 hour hold, the batch was allowed to cool to room temperature. The water was removed from the batch by alternate vacuum distillation and addition of 1500 grams 1-methoxy-2-propanol. The batch was concentrated by vacuum distillation to result in a very fluid translucent dispersion with 62.3 wt % solids.

A 250 ml one-neck round bottom flask was charged with 20.82 grams of the 62.3 wt % solids dispersion of A174-Zirconia. To this dispersion, 100 grams of 1-methoxy-2propanol, 0.5 grams of ammonium hydroxide and Sartomer SR9038 (Warrington, Pa.) were added with mixing. The flask was placed on a Rotovapor and vacuum distilled to remove the solvent. The yield after distillation was 102.3 grams. A total of 96.9 grams of this translucent, blue/yellow dispersion was transferred to a 120 ml amber bottle. To this bottle 0.097 grams Irgacure TPO (BASF, Florham Park, N.J.) and 0.484 grams Darocur 1173 (BASF, Florham Park, N.J.) were added. The dispersion was mixed to ensure dissolution of the photoinitiators.

A bridge resin solution was created by mixing the Zr filled 9038 mixture described above with PermaNew 6000 (available from California Hardcoating Company, Chula Vista, Calif.) in a 90:10 resin:PermaNew ratio.

All process steps described in Example 6a above are used, except the Zr filled SR9038 described above is used as the bridge resin. A cross-sectional SEM micrograph from the resulting microstructure using a silica filled backfill and a zirconia filled bridge is shown in FIG. 17.

Example 6c

Zirconia Structured Layer, Silica Bridge Layer

A bridge resin solution was created by mixing 60 wt. % of the PBD-2900 resin described above, mixed with 40 wt. % SR601 ethoxylated bisphenol diacrylate (Sartomer Co, Exton, Pa.), and including a photoinitator package comprising 0.5% Darocur 1173 and 0.1% TPO. This resin solution was mixed with PermaNew 6000 (available from California Hardcoating Company, Chula Vista, Calif.) in a 90:10 resin: PermaNew ratio.

A backfill coating solution was created in the following manner: A 500 ml 3-neck round bottom flask was charged with 175.0 grams of a 45.4 wt % solids dispersion of 10 nm zirconia particles (prepared as described in U.S. Pat. No. 7,241,437 and U.S. Pat. No. 6,376,590). Next, the flask was equipped with a stir bar, stir plate, condenser, heating mantle, thermocouple and temperature controller. With the batch mixing, 78.8 grams methyltriethoxysilane, MTES, (Alfa Aesar, Ward Hill, Mass.) and 80.0 grams anhydrous alcohol (95/5 v/v ethanol/2-propanol, Avantor Performance Materials Inc, Center Valley, Pa.) were added to the batch. The batch was held for 1 hour at room temperature with mixing. After 1 hour, the batch heated to 70° C. and held at 70° C. for 4 hours with mixing. After the 4 hour hold, the batch was allowed to cool to room temperature. This dispersion was filtered through a 1 micron 37 mm syringe filter (Pall Life Sciences, Ann Arbor, Mich.) into a 32 ounce glass bottle. The final sample was a low viscosity, slightly hazy, translucent dispersion and was measured to be 32.9 wt. % solids.

All process steps described in Example 6a above are used, except the PBD-2900/SR601 mixture described above was used as the bridging resin, and the backfill coating solution was the Zr solution described above instead of the PermaNew solution. A cross-sectional SEM micrograph from the resulting microstructure using a zirconia filled backfill and a silica filled bridge is shown in FIG. 18.

Example 6d

Zirconia Structured Layer, Zirconia Bridge Layer

All process steps described in Example 6a above are used, except the Zr/9038 mixture described in example 6b was used as the bridging resin, and the backfill coating solution was the Zr solution described in example 6c instead of the PermaNew solution. A cross-sectional SEM micrograph from the resulting microstructure zirconia filled backfill and a zirconia filled bridge is shown in FIG. 19.

Example 7

Figure 15:
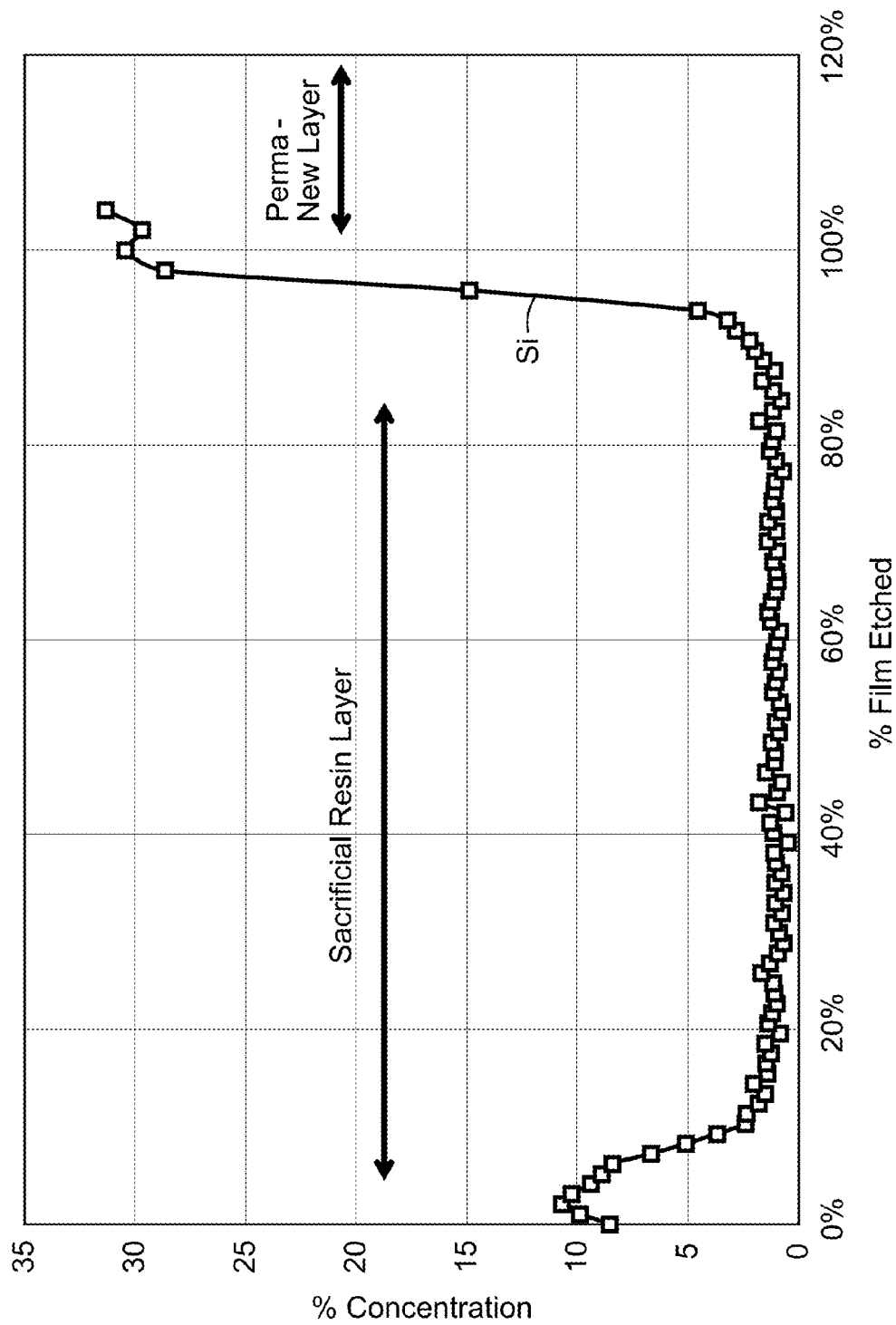
FIG. 15 is a graph of XPS atomic concentration as a function of film depth of an illustrative transfer film labeled 2900-

In order to quantify the migration of molecular species into the sacrificial resin during the backfilling process, we prepared a flat film of the PBD-2900/601 sacrificial resin mixture, described in Example 1, then coating the thermally stable backfill material for elemental analysis by XPS. Flat films were coated using a notch bar on an unprimed PET substrate and cured with ultraviolet radiation to a non-tacky state. The film thickness was ~1.96 μm for the PBD-2900/601 sample as measured by optical interferometry. PermaNew-6000 was spin coated per Example 6, over these films and cured at 80° C. for four hours to match the traditional sample preparation technique. IOA/AA Optically Clear Adhesive of Example 6, was spin coated and dried onto these coatings and the film stack was laminated to a glass slide. The unprimed PET was peeled off the film stack to expose the bottom surface of the resin samples. The samples were not placed in the oven for the final bake-out step. With the resin sample remaining intact, the sample was analyzed using x-ray photoelectron spectroscopy to determine the elemental composition as a function of depth through the film. Table 4 shows the experimental conditions for this XPS analysis. A $C_{60}$ ion gun was used to ablate away layers of the resin in order to profile the composition at successive depths, all the way down to the cured Perma-New layer. The % of film etched was determined using established etch rates of each of the resins under the $C_{60}$ ion gun. The etch rate were determined by taking the known thickness of each resin layer divided by the sputter time in order to reach the bulk of the Perma-New coating (marked by 30% silicon signal) in each of the film stacks. Then, the etch rate was used to convert etch time into etch depth (in nanometers) for each resin coating. Finally, the etch depth of each coating was normalized to find % of film etched. The result is shown in FIG. 15. The higher atomic silicon concentration between 0 and 10% in the sacrificial resin layer (PBD-2900/SR601) spectrum corresponds to a layer of migrated polysiloxane chains about 100-200 nm thick that formed in the lower regions of the coating during the spin coating and baking step.

TABLE 4

| XPS analysis conditions for resin depth profiling experiment | |
|---|---|
| Instrument | Physical Electronics VersaProbe 5000 ™ |
| analysis areas | 500 μm × 1500 μm |
| photoelectron take off angle | 45° ± 20° solid angle of acceptance |
| x-ray source | Monochromatic Al Kα (1486.6 eV) 85 W |
| charge neutralization | Low energy e⁻ and Ar⁺ flood sources |
| charge correction | C—C,H 284.8 eV |
| sputter ion gun conditions | 10 keV $C_{60}^+$ 3 mm by 3 mm raster, ~12 nA target current |
| analysis chamber pressure | ~5 × 10⁻⁸ Torr |

Thus, embodiments of LAMINATION TRANSFER FILMS FOR FORMING ARTICLES WITH ENGINEERED VOIDS are disclosed.

All references and publications cited herein are expressly incorporated herein by reference in their entirety into this disclosure, except to the extent they may directly contradict this disclosure. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof. The disclosed embodiments are presented for purposes of illustration and not limitation.

What is claimed is:
1. A method of forming a transfer film, comprising:
 applying a thermally stable backfill layer to a structured surface of a sacrificial template layer, the thermally stable backfill layer conforms to the structured surface of the sacrificial template layer and comprises thermally stable molecular species; and
 allowing a portion of the thermally stable molecular species to migrate into the sacrificial template layer to form the transfer film.
2. The method according to claim 1, wherein the allowing step forms a gradient of thermally stable molecular species within the sacrificial template layer and the gradient comprises a concentration of thermally stable molecular species that increases as a function of a distance from the structured surface.
3. The method according to claim 1, wherein the sacrificial template layer is cleanly baked out leaving a bridging layer disposed on the structured surface and defining engineered voids.
4. The method according to claim 1, wherein the thermally stable molecular species comprises a metal or metal oxide or metal oxide precursor.
5. The method according to claim 1, wherein the thermally stable molecular species comprises an organosilicon polymer.

6. The method according to claim 4, wherein the sacrificial template layer comprises a (meth)acrylic polymer.

7. The method according to claim 6, wherein the (meth)acrylic polymer comprises a majority of polyether segments or a majority of ethoxylated segments.

* * * * *